(12) United States Patent
Foster

(10) Patent No.: US 11,101,633 B2
(45) Date of Patent: Aug. 24, 2021

(54) CIRCUIT PROTECTION SYSTEM AND METHOD

(71) Applicant: Frederick M. Foster, Wallingford, CT (US)

(72) Inventor: Frederick M. Foster, Wallingford, CT (US)

(*) Notice: Subject to any disclaimer, the term of this patent is extended or adjusted under 35 U.S.C. 154(b) by 10 days.

(21) Appl. No.: 16/272,461

(22) Filed: Feb. 11, 2019

(65) Prior Publication Data

US 2019/0190246 A1 Jun. 20, 2019

Related U.S. Application Data

(63) Continuation-in-part of application No. 15/292,799, filed on Oct. 13, 2016, now Pat. No. 10,250,027.

(Continued)

(51) Int. Cl.
*H02H 3/20* (2006.01)
*H02H 3/08* (2006.01)
(Continued)

(52) U.S. Cl.
CPC ......... *H02H 3/08* (2013.01); *G01R 19/16528* (2013.01); *H02H 3/20* (2013.01);
(Continued)

(58) Field of Classification Search
CPC ........... H02H 3/08; H02H 3/20; H02H 5/042; H02H 3/046; H02H 7/26; H02H 9/008;
(Continued)

(56) References Cited

U.S. PATENT DOCUMENTS

| 4,237,440 A | 12/1980 | Miyasaka et al. |
| 5,086,368 A | 2/1992 | Gerke et al. |

(Continued)

FOREIGN PATENT DOCUMENTS

| CN | 1787314 A | 6/2006 |
| CN | 103427674 A | 12/2013 |

(Continued)

OTHER PUBLICATIONS

Notice of Preliminary Rejection dated Jan. 21, 2020 from corresponding Korean Patent Application No. 10-2018-7012374, 17 pages.

(Continued)

*Primary Examiner* — Danny Nguyen
(74) *Attorney, Agent, or Firm* — Ohlandt, Greeley, Ruggiero & Perle, L.L.P.

(57) ABSTRACT

A DC and/or an AC power transmission circuit protection system is for protection of a cabling medium. The circuit protection system includes a power supply, a powered device and a circuit protection module that includes an over-current and/or over-voltage circuit module and/or a heat circuit protector. The protection system is disposed between the power supply and the powered device, and interrupts an electrical current that flows through the cabling medium when the over-current and/or over-voltage circuit module and/or the circuit protector exceeds a predetermined level. There is also provided a method to dispose the circuit protection system and the circuit protection module within the circuit and to interrupt the circuit when over-current and/or over-voltage circuit module and/or heat circuit protector exceeds a predetermined level.

26 Claims, 36 Drawing Sheets

Related U.S. Application Data

(60) Provisional application No. 62/242,534, filed on Oct. 16, 2015.

(51) Int. Cl.
  *H02H 5/04* (2006.01)
  *H02H 7/26* (2006.01)
  *G01R 19/165* (2006.01)
  *H02H 9/00* (2006.01)
  *H02H 3/04* (2006.01)

(52) U.S. Cl.
  CPC .............. *H02H 5/042* (2013.01); *H02H 7/26* (2013.01); *H02H 9/008* (2013.01); *H02H 3/046* (2013.01)

(58) Field of Classification Search
  CPC ... H02H 9/00; G01R 19/16528; G01R 19/165
  USPC ........................................ 361/91.1, 117–119
  See application file for complete search history.

(56) References Cited

U.S. PATENT DOCUMENTS

| | | | |
|---|---|---|---|
| 5,384,428 | A | 1/1995 | Luu |
| 5,844,326 | A | 12/1998 | Proctor et al. |
| 6,816,350 | B1 | 11/2004 | Hoopes |
| 8,243,412 | B2 | 8/2012 | Wiese |
| 9,158,325 | B1 | 10/2015 | Lim |
| 2004/0236967 | A1* | 11/2004 | Korcharz ............... G06F 1/266 713/300 |
| 2004/0246644 | A1 | 12/2004 | Sato |
| 2006/0120000 | A1 | 6/2006 | Fiesoli et al. |
| 2006/0262713 | A1 | 11/2006 | Karam |
| 2007/0165348 | A1 | 7/2007 | Nelson et al. |
| 2008/0130185 | A1 | 6/2008 | Masghati |
| 2008/0182437 | A1 | 7/2008 | Kozak et al. |
| 2009/0027821 | A1 | 1/2009 | Colby et al. |
| 2010/0277325 | A1 | 11/2010 | Kopelman |
| 2012/0094509 | A1 | 4/2012 | Bryan et al. |
| 2012/0139741 | A1 | 6/2012 | Deng |
| 2013/0021704 | A1 | 1/2013 | Tseng et al. |
| 2014/0104737 | A1 | 4/2014 | Coffey et al. |
| 2015/0255930 | A1 | 9/2015 | Lee |
| 2015/0309271 | A1 | 10/2015 | Huegerich |
| 2015/0312048 | A1* | 10/2015 | Bodo ................... H02J 13/0062 713/300 |

FOREIGN PATENT DOCUMENTS

| | | |
|---|---|---|
| CN | 104125076 A | 10/2014 |
| CN | 104201662 A | 12/2014 |
| JP | 2004-503972 A | 2/2004 |
| JP | 2007-523457 A | 8/2007 |
| JP | 2014-502131 A | 1/2014 |
| WO | 01/97339 A1 | 12/2001 |
| WO | 2005/078871 A1 | 8/2005 |
| WO | 2012/050610 A1 | 4/2012 |
| WO | 2014/161009 A2 | 10/2014 |

OTHER PUBLICATIONS

International Search Report dated Jan. 10, 2017 from corresponding International Application No. PCT/US2016/056828, 4 pages.
Written Opinion dated Jan. 10, 2017 from corresponding International Application No. PCT/US2016/056828, 11 pages.
International Preliminary Report on Patentability dated Jan. 26, 2018 from corresponding International Application No. PCT/US2016/056828, 20 pages.
Chinese First Office Action dated Apr. 24, 2019 from corresponding Chinese Patent Application No. 201680060631.X, 21 pages.
Extended European Search Report dated Jul. 25, 2019 from corresponding European Patent Application No. 16856186.8, 11 pages.
Third Chinese Office Action dated May 12, 2020 from corresponding Chinese Patent Application No. 201680060631.X, 9 pages.
Examination Report dated Nov. 21, 2019 from corresponding Indian Patent Application No. 201847013636, 5 pages.
Japanese Notification of Reasons for Refusal dated Nov. 17, 2020 from corresponding Japanese Patent Application No. 2018-519429, 14 pages.

* cited by examiner

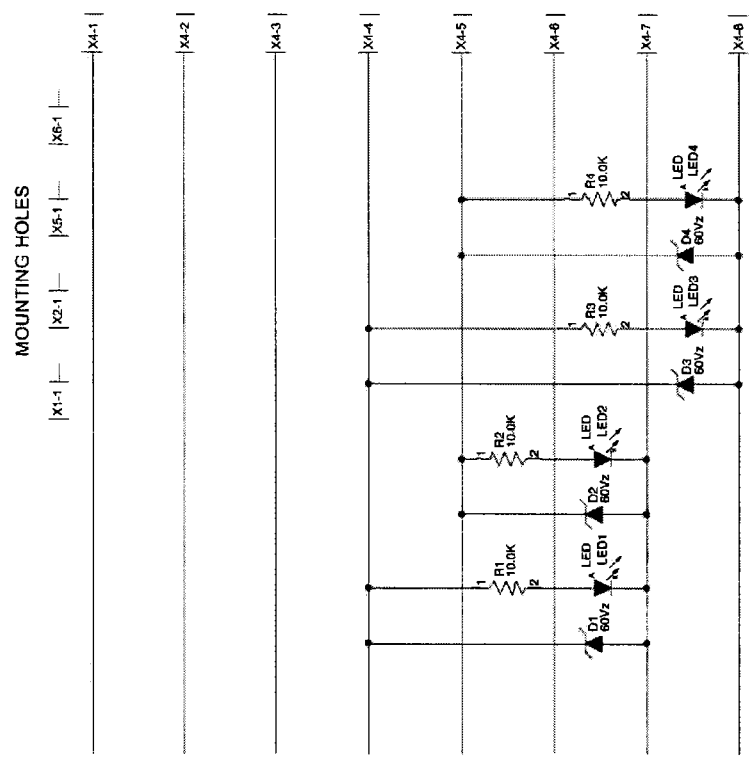
Fig. 3B-b

Figure 3D

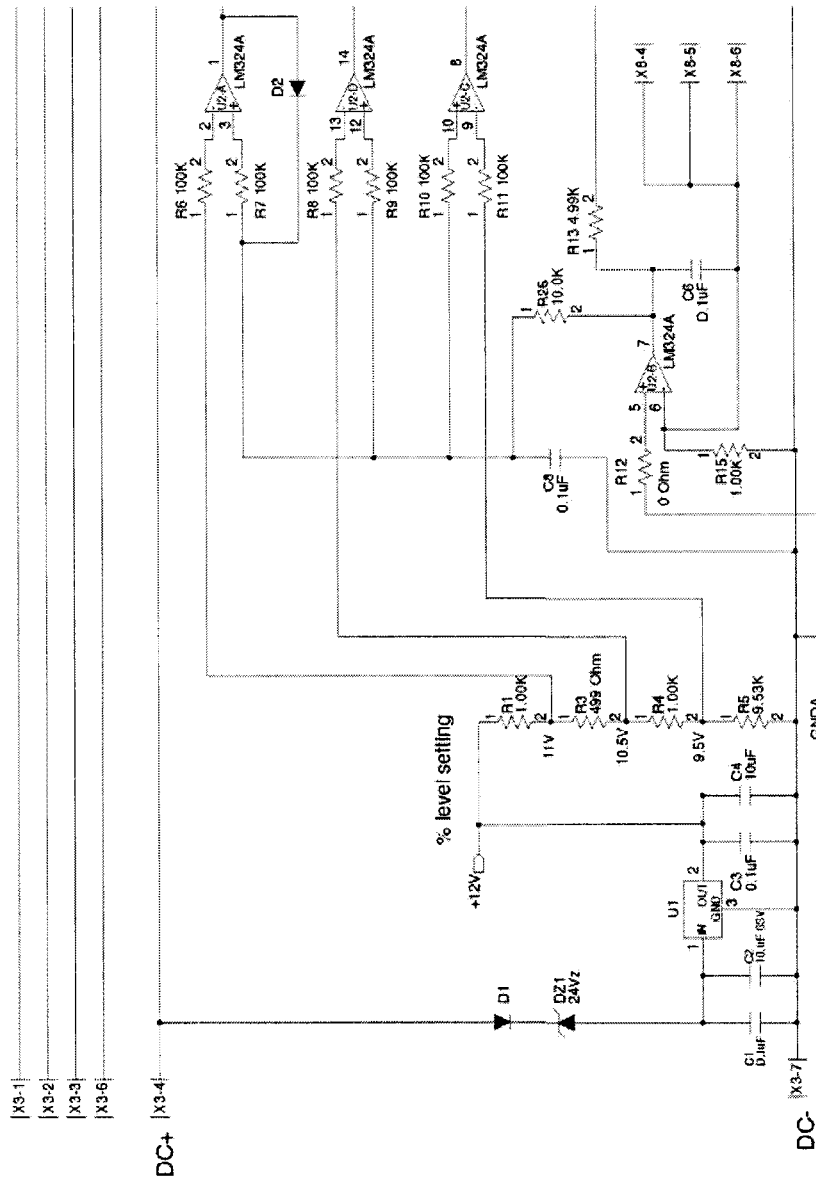
Fig. 3D-a

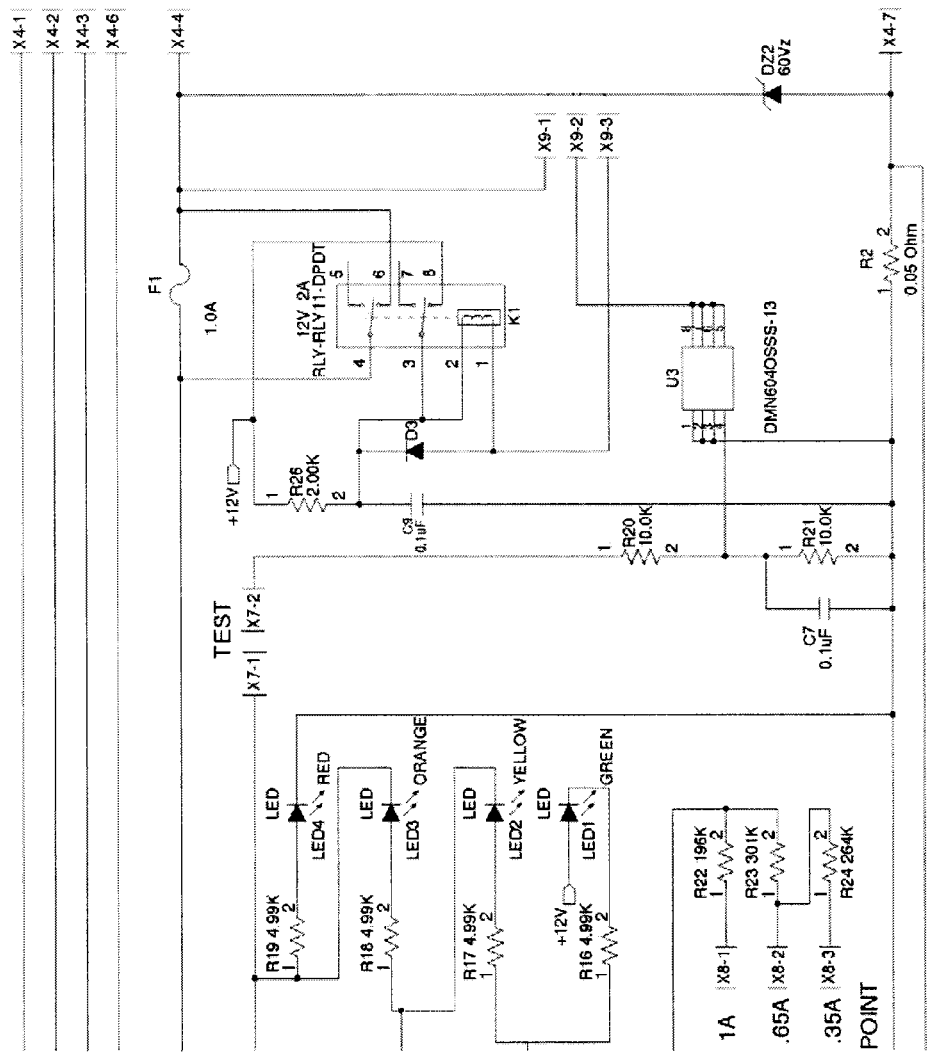
Fig. 3D-b

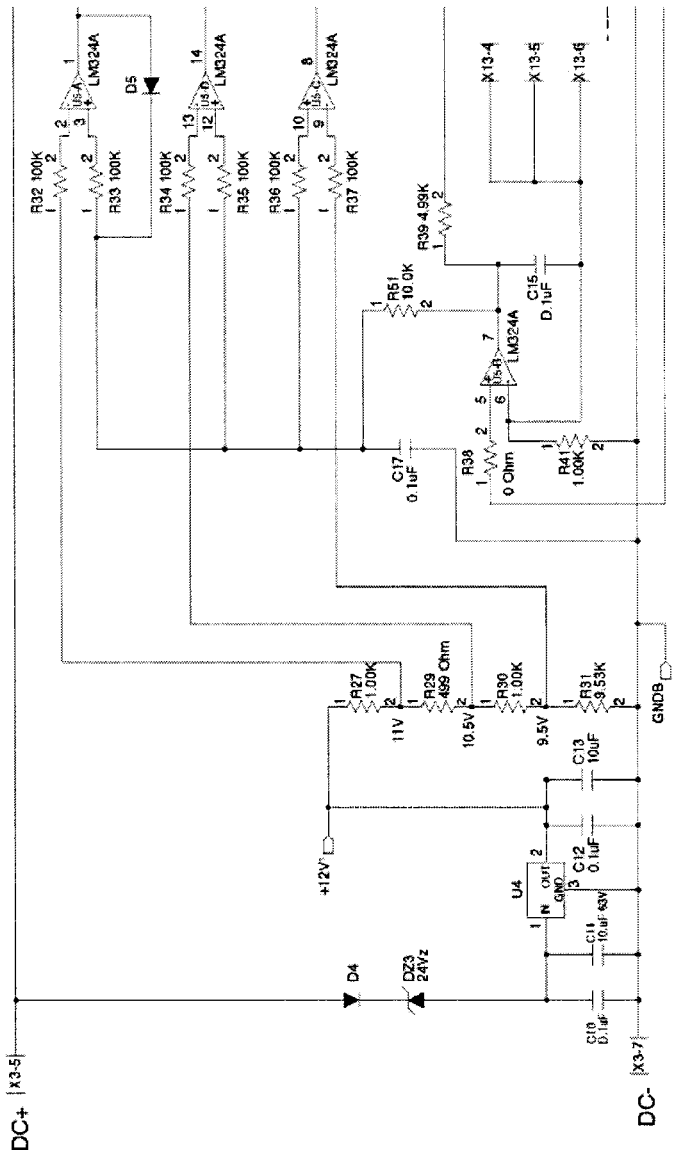
Fig. 3D-c

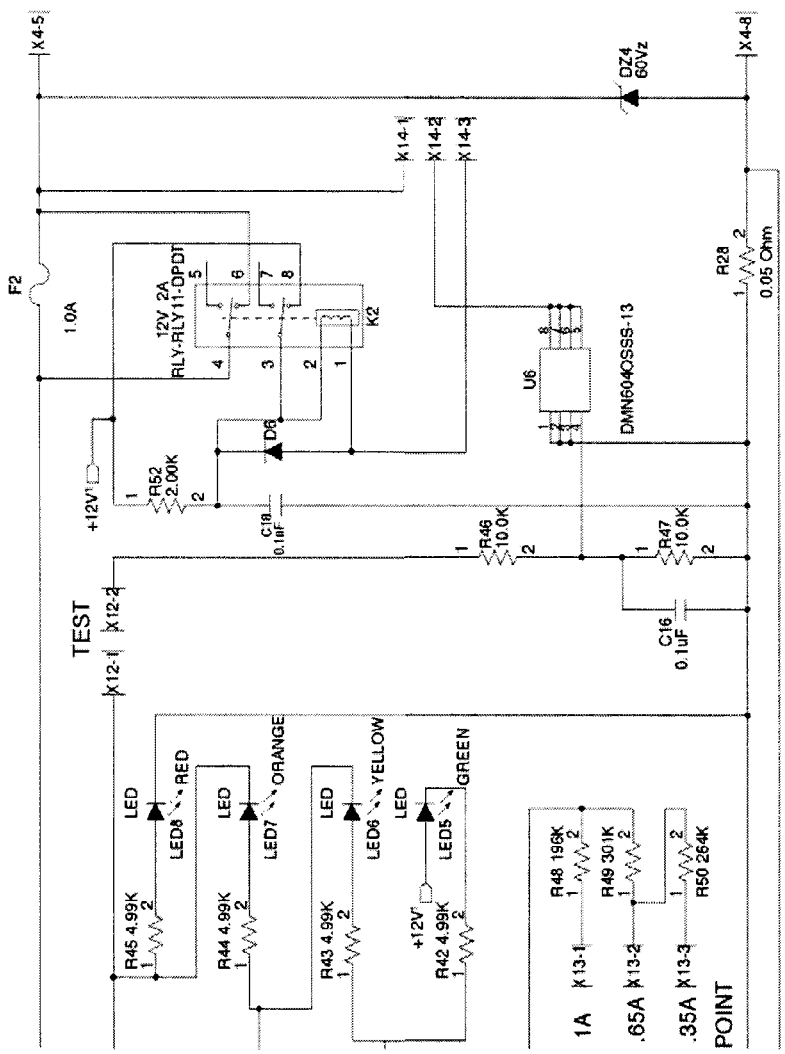
Fig. 3D-d

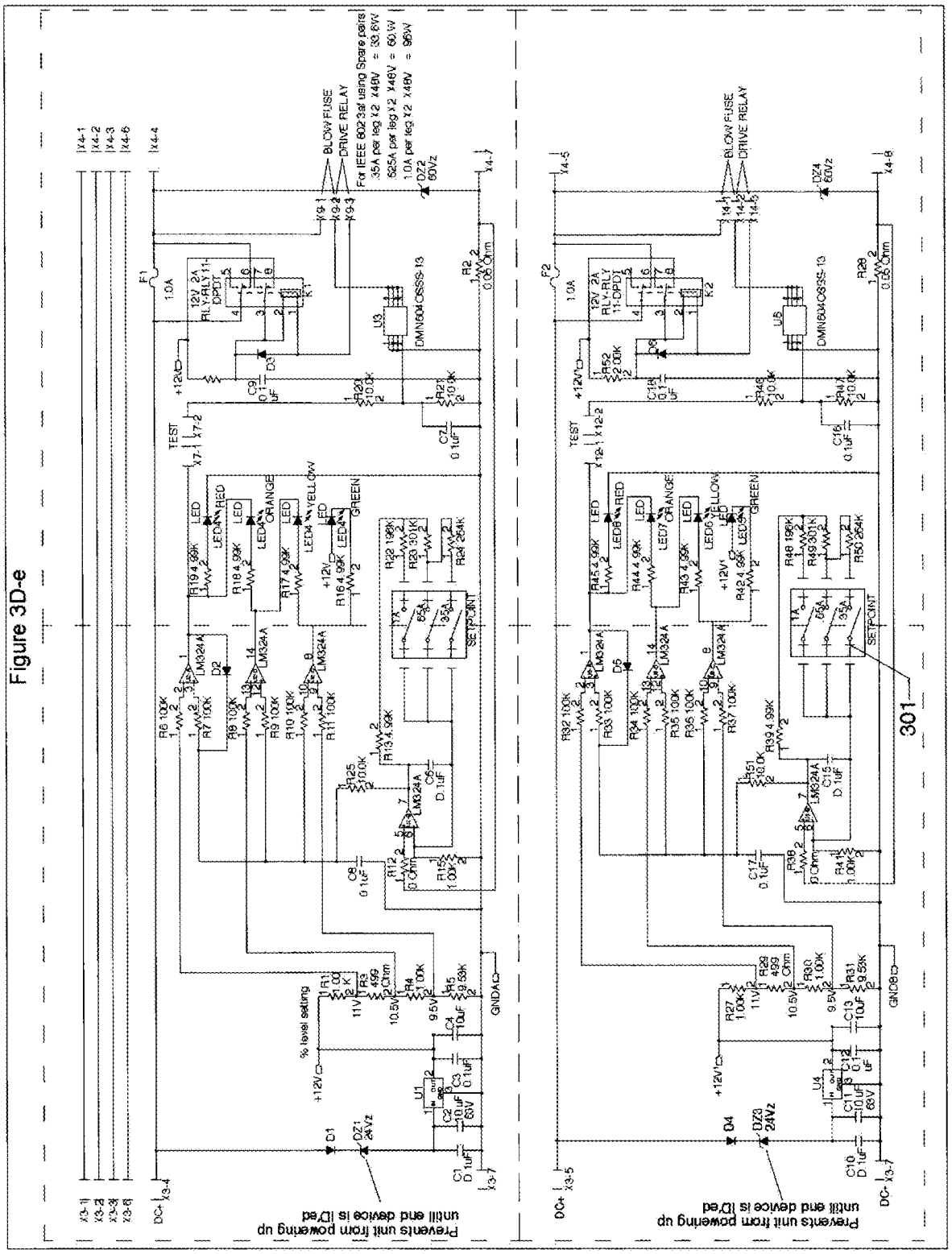
Figure 3D-e

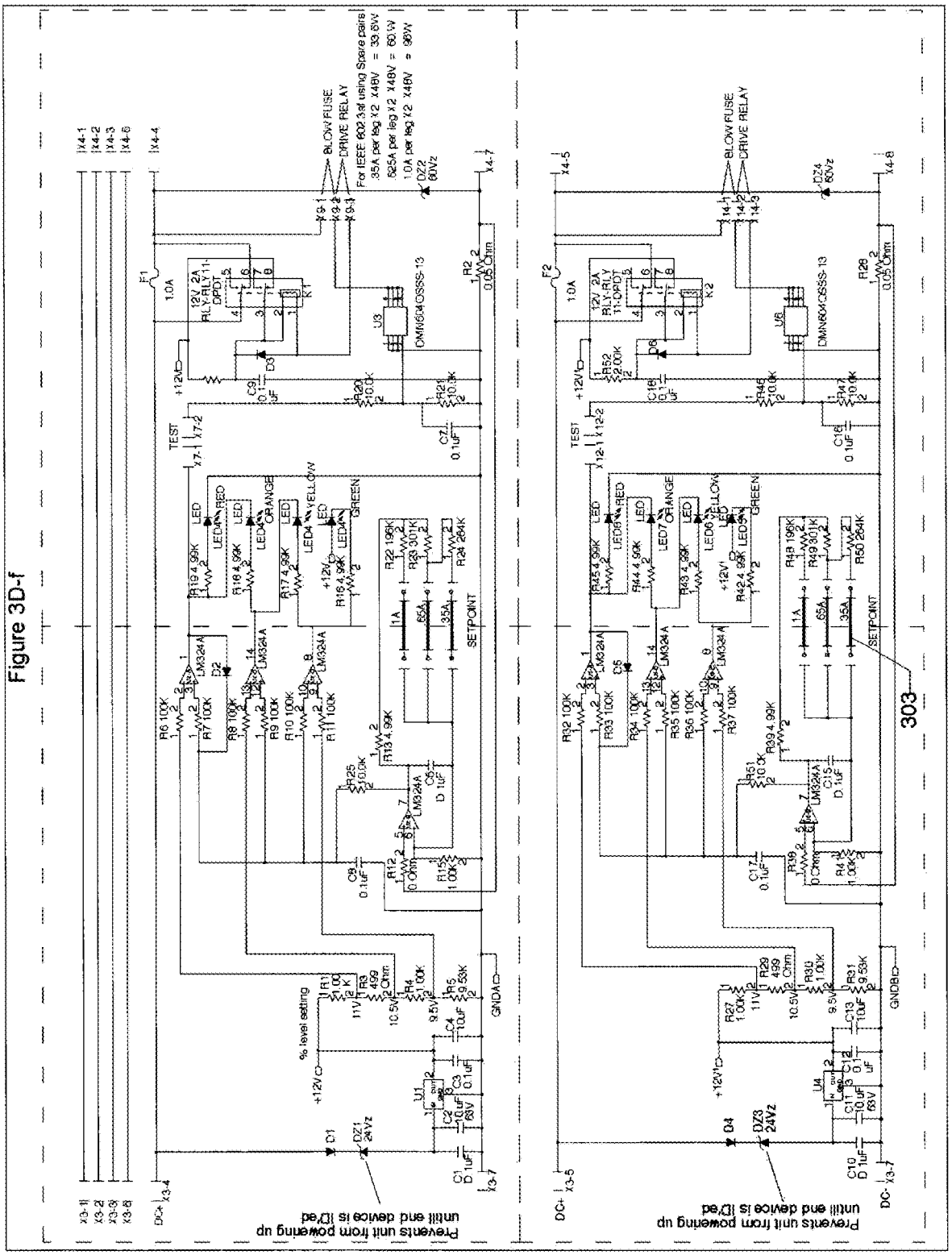
Figure 3D-f

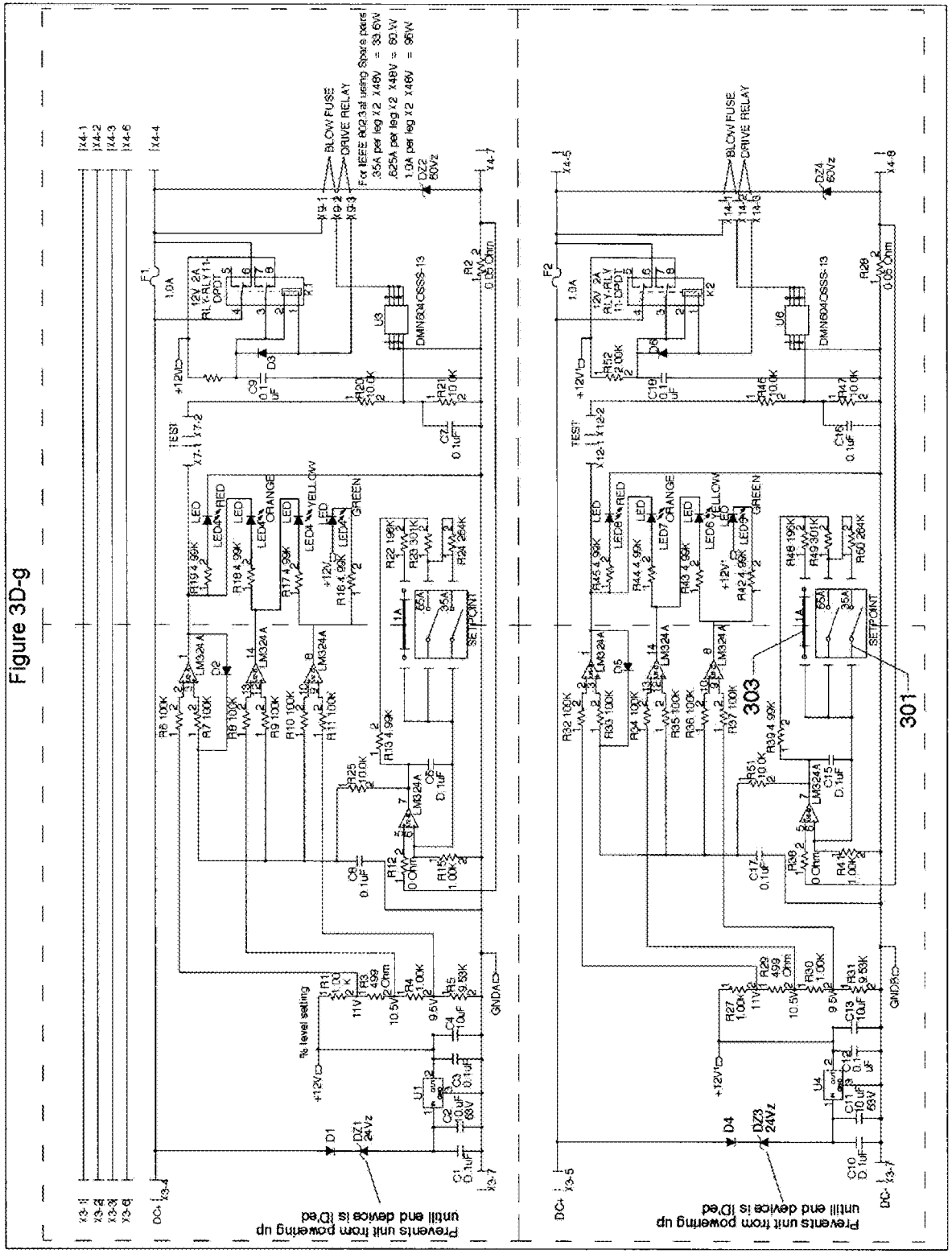

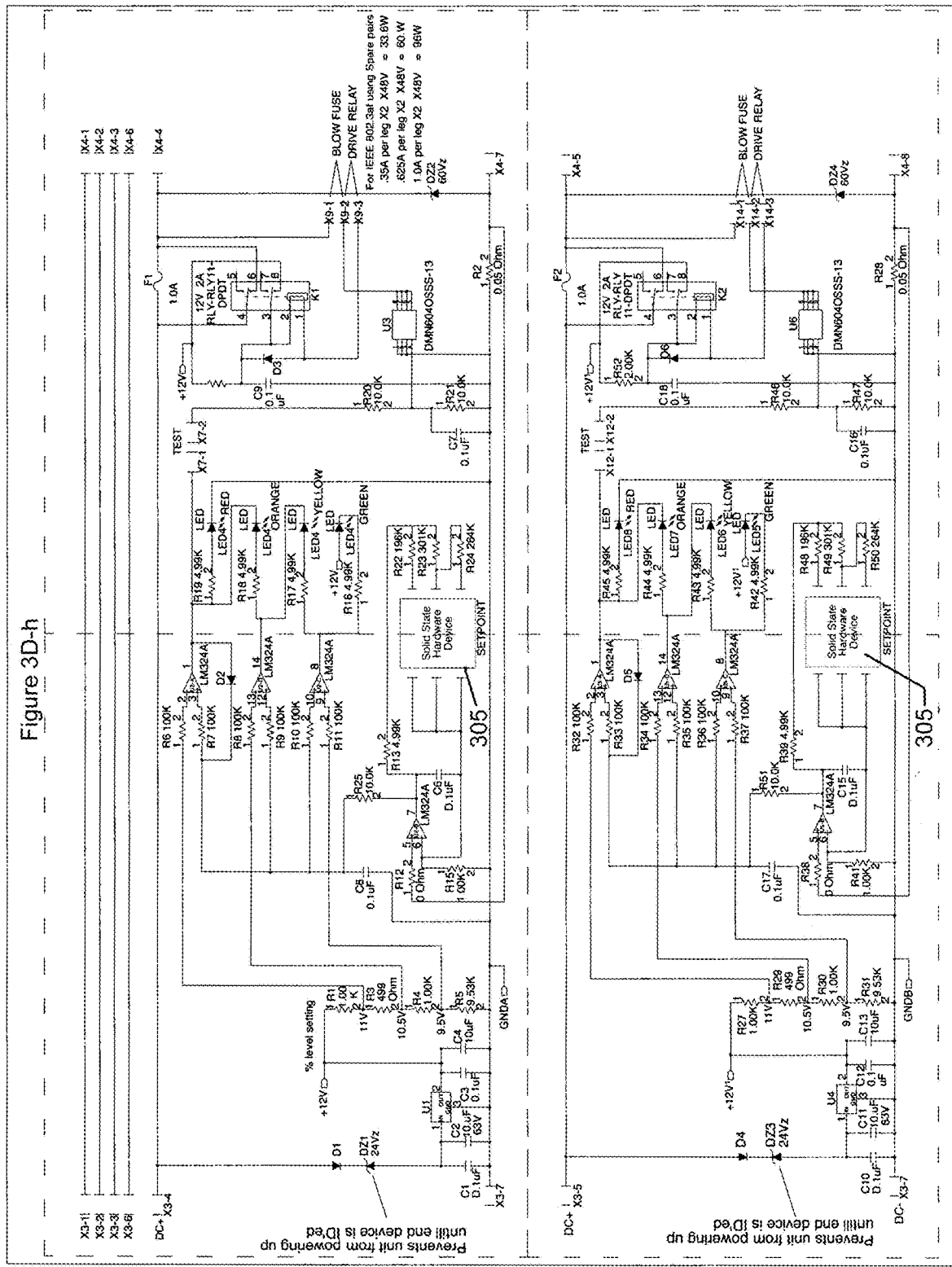

| Item | Qty | Reference | Description |
|---|---|---|---|
| 1 | 2 | X3-4 | RJ45 Jack |
| 2 | 6 | C2,4,9,11,13,18 | 10.uF 63V |
| 3 | 10 | C1 C3 C6-8 C10 C12 C15-17 | 0.1uF |
| 4 | 2 | X7 X12 | 2 Pin Header |
| 5 | 2 | X9 X14 | 3 Pin Header |
| 6 | 2 | X8 X13 | 2x3 pin Header |
| 7 | 6 | | jumper X7-9, 12-14 |
| 8 | 6 | D1-6 | FDL4148 |
| 9 | 2 | F1-2 | Fuse 1.0A 125V |
| 10 | 2 | D22 D24 | TVS DIODE |
| 11 | 2 | D21 D23 | DIODE ZENER 24V |
| 12 | 2 | U2 U5 | LM324 |
| 13 | 2 | U1 U4 | IC REG LDO 12V 15MA |
| 14 | 2 | U3 U6 | MOSFET N CH 60V 5.5A |
| 15 | 2 | K1-2 | Relay DPDT 2A 12V |
| 16 | 2 | LED1, 5 | LED GREEN |
| 17 | 2 | LED2, 6 | LED YELLOW |
| 18 | 2 | LED3, 7 | LED ORANGE |
| 19 | 2 | LED4, 8 | LED RED |
| 20 | 2 | R12 R38 | 0 OHM |
| 21 | 6 | R1 R4 R15 R27 R30 R41 | 1.0 K 1% |
| 22 | 6 | R20-21 R25 R46-47 R51 | 10.0K |
| 23 | 12 | R6-11 R32-37 | 100 K 1% |
| 24 | 2 | R22 R48 | 196K |
| 25 | 2 | R26 R52 | 2.00K |
| 26 | 2 | R24 R50 | 261K |
| 27 | 2 | R23 R49 | 301K |
| 28 | 10 | R13 R16-19 R39 R42-45 | 4.99 K 1% |
| 29 | 2 | R3 R29 | 499 1% |
| 30 | 2 | R5 R31 | 9.53K |
| 31 | 2 | R2 R28 | 0.05 OHM 1% 1206 |
| 32 | 1 | PCB | 4.8" by 1.675" 2 side 1oz Cu |

Fig. 3E

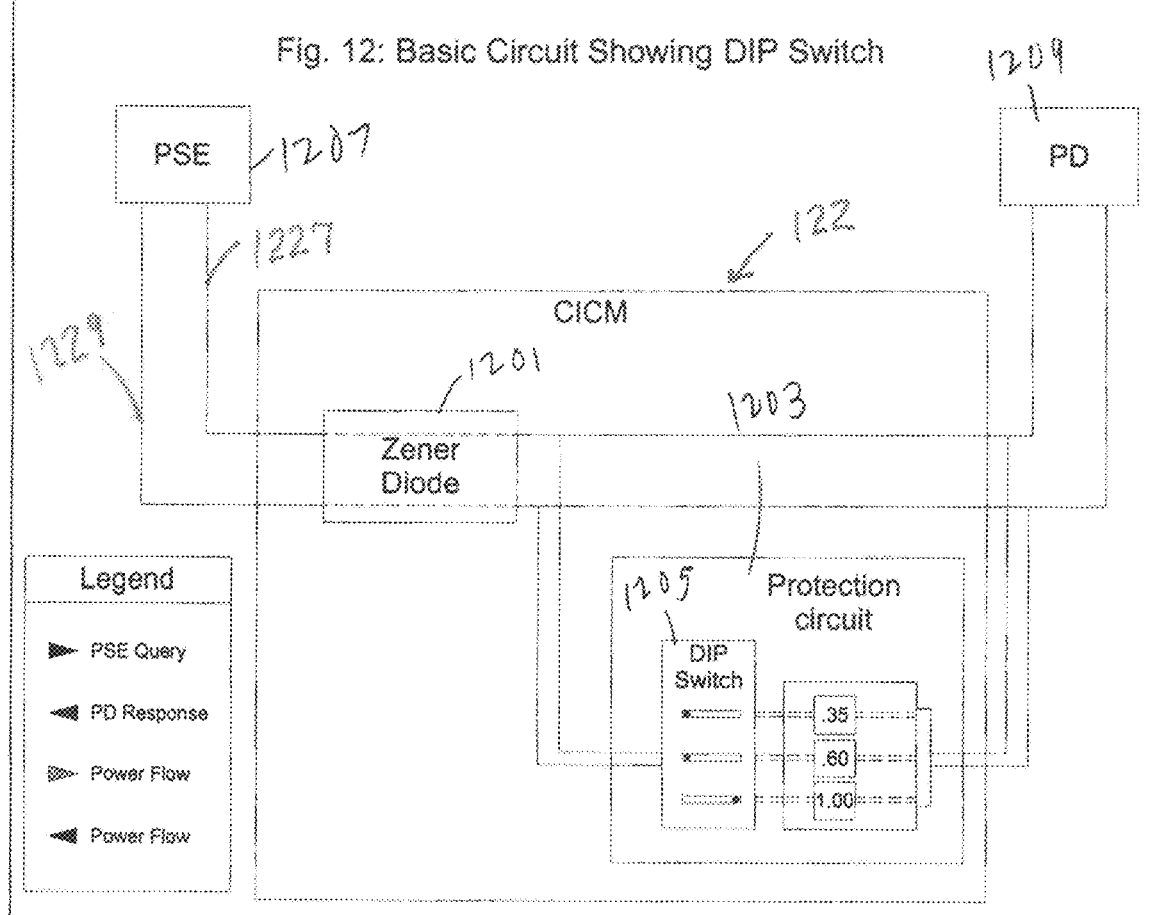

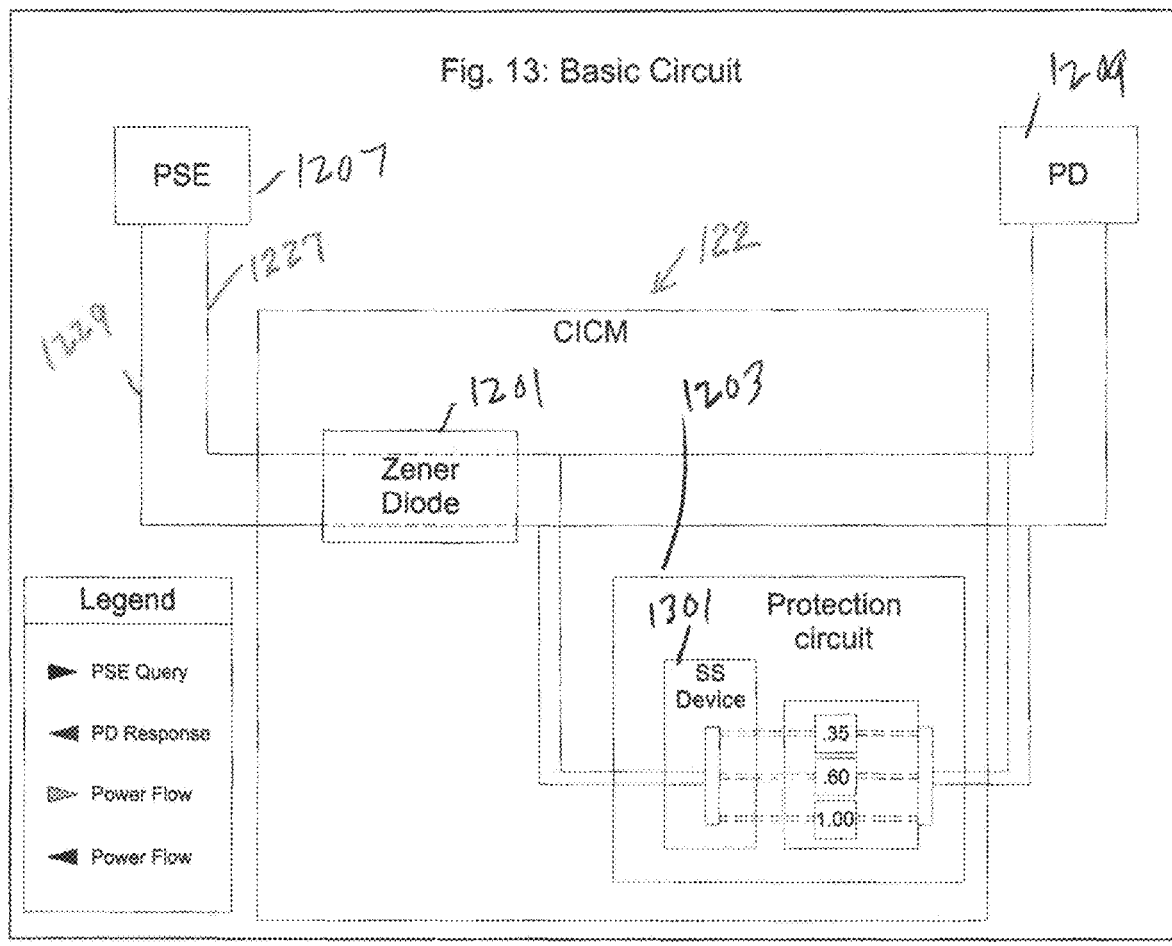

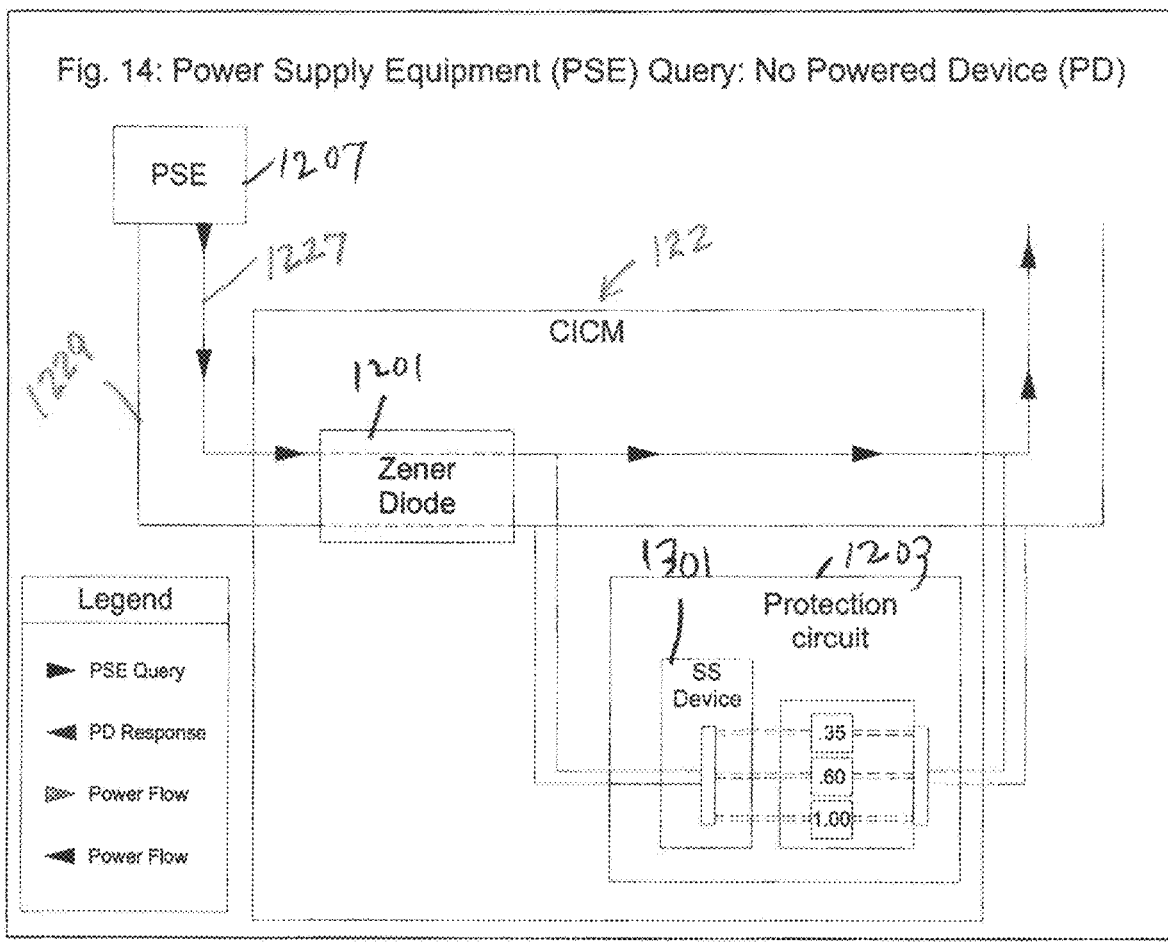

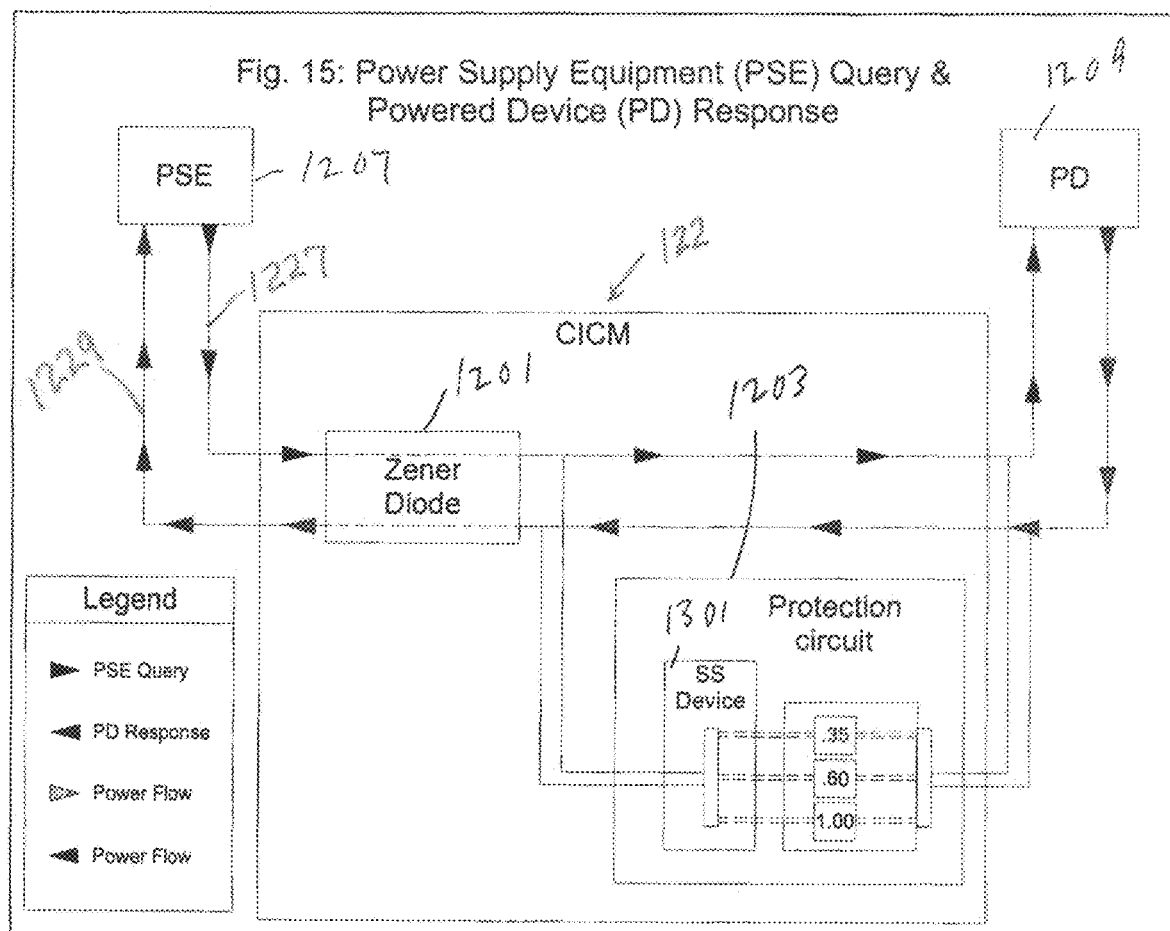

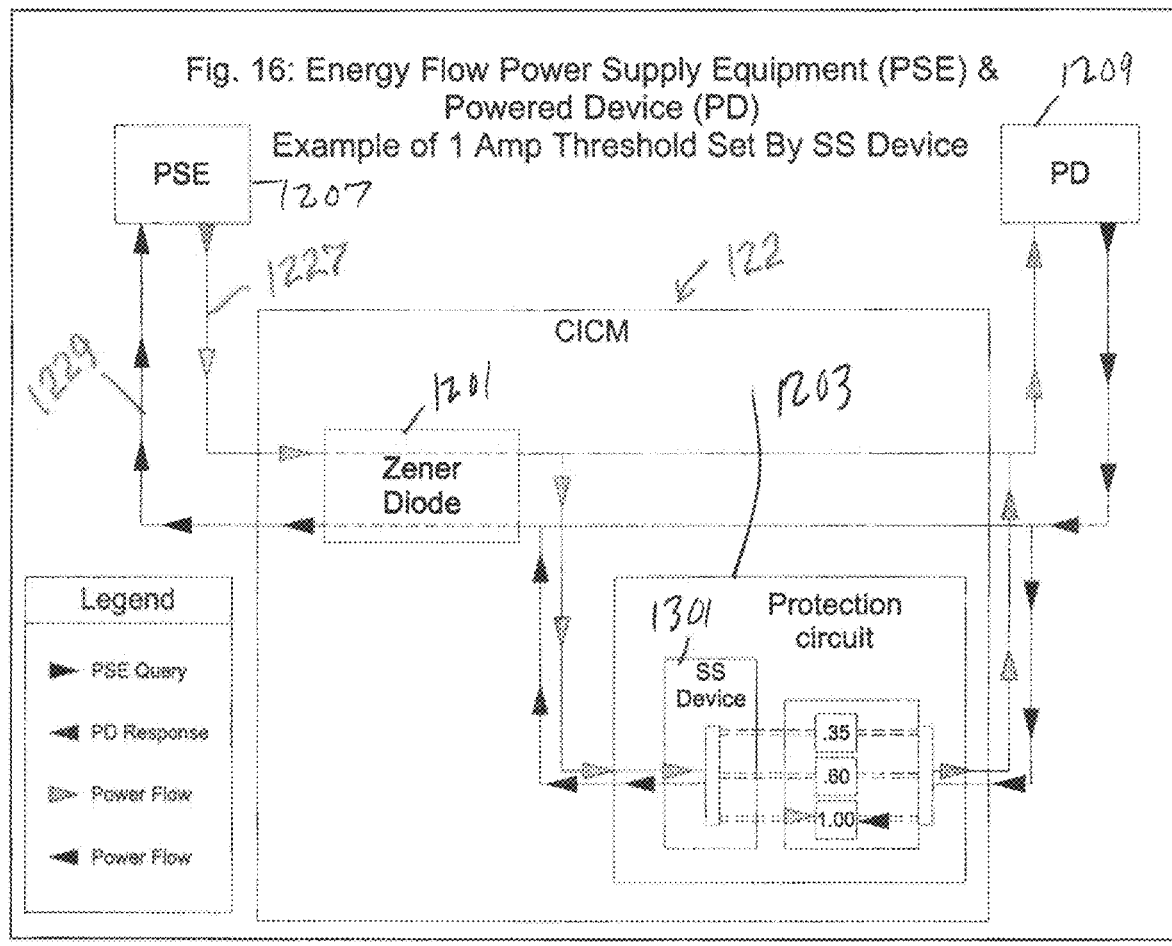

CIRCUIT PROTECTION SYSTEM AND METHOD

CROSS-REFERENCE TO RELATED APPLICATIONS

The present application is a continuation-in-part of U.S. application Ser. No. 15/292,799 filed on Oct. 13, 2016, which claims the benefit of U.S. Provisional Application Ser. No. 62/242,534, filed Oct. 16, 2015, the entire contents of which are hereby expressly incorporated by way of reference.

BACKGROUND OF THE DISCLOSURE

1. Field of the Disclosure

The present disclosure relates generally to a circuit protection system and a method for over-current and over-voltage protection for communication cabling medium and various traditional and emerging cable construction and materials of emerging devices. Emerging devices include, but are not limited to, currently known devices using Power over Ethernet (PoE) technology. More particularly, the present disclosure relates to a circuit protection system and a method to provide over-voltage and/or over-current protection for communication circuits and associated wires and conductors, especially, for the current National Electrical Code (NEC) classification Chapter 7 class 2 & 3 circuits and Chapter 8 communication circuits. A protection module of circuit protection system is disposed at any point between a power supply and a powered device and can limit the electrical current allowed to pass into the circuit based on the physical construction, wire gauges, and other factors representing the limitations of communication cabling medium. Further, circuit protection system has an ability of detecting heat rise of communication cabling medium and provides a maximum temperature threshold disconnect that allows for protection of thermal degradation of the communication cable medium.

2. Description of Related Art

Traditionally, communication circuits and associated wires and conductors were designed and intended for transmission of low power (i.e. phantom voltage) and data communication signals, and cabling systems and components were not originally designed to transmit high levels of power.

Unfortunately, current electrical and building codes and standards do not address the issue of utilizing communication cables (e.g., twisted pair based and/or coaxial cables) and their conductors as a power transmission medium. Nowadays there is an overwhelming trend in the market to utilize low voltage power communication cabling medium to replace wiring systems that have traditionally been relied upon to transmit high voltage alternating current (AC) power. These systems include, but are not limited to, computers, room and building lighting, remote cameras, wireless access points, patient monitoring systems, access card readers, building automation systems, and others. Unlike many traditional higher voltage AC wiring systems, equipment based on many of new technologies can be accessed by all members of a family including very young children. For example, many families allow their very young children to operate all aspects of the family IPad® including plugging and un-plugging from a charging station. The common belief is that these coaxial cables and/or twisted pair based cables are non-power outlets and therefore they will not hurt people. However, as the trend toward PoE and similar technologies continue to evolve, without a circuit protection system, the equipment accessible to people can possibly result in significant damage.

With the current environment of rapid innovation within this vertical market, it will become increasingly difficult to regulate or enforce power based safety issues. An example of this difficulty is to check a code compliant communication system that has been installed within a facility today. If the manager of this facility decides to have a large reduction in operating expense by implementing PoE or similar technologies, which is up to 30 watts today, throughout this facility, there will be no issue with the manager's plan, since the communication network was installed and the building received its Certificate of Occupancy (CO). Generally, before the approval of the occupancy of any building structure, the Authority Having Jurisdiction (AHJ) needs to inspect facility structures to ensure that they comply with applicable safety codes and requirements. Receiving the CO certifies means that the structure or building has passed all of the required fire and safety inspections. However, it can still present many fire and safety problems if the next manager decides to install PoE++ or other powering technologies, which can be possibly up to 200 watts, since communication systems, including the cabling systems, were not originally designed to transmit such high power levels, and the cabling systems are located inside the walls and the detailed information about the cabling systems cannot be obtained easily.

As the power continues to increase within these cabling systems, ancillary ramifications will emerge. The heat generated by the power transmission will rise across the circuit and its components. The increase in heat can cause a vastly increased rise in temperature when these twisted pairs and coaxial cables are bundled such as in a riser, trunk, composite design, or when implemented in combined pathways. These pathways can include, but are not limited to, cable tray, flexible conduit and ridged conduit systems. The heat rise has the potential to melt current insulation and jacketing materials, and can possibly result in a condition of arcing and eventual fire. Moreover, environmental factors such as ambient air temperature and weather conditions can contribute to increased heat generation in cables.

Accordingly, there will be a need for over-voltage, over-current, and power limiting protection for life safety and/or equipment failures. It is desirable to have an over-current limiting control point within the circuit protection system to allow protection for the physical cables and conductor media, active equipment and persons, and help people implement life safety regulations.

SUMMARY

The present disclosure discloses a circuit protection module comprising an over-current and/or over-voltage circuit module and/or a heat circuit protector.

A Power over Ethernet (PoE) cable medium circuit protection module comprising: an over-current and/or over-voltage circuit module and/or a heat circuit protector which measures or detects heat rise of the PoE cable medium, wherein the over-current and/or over-voltage circuit module comprises a switching device for setting a predetermined power level for the over-current and/or over-voltage circuit module, thereby prohibiting transmission of electrical power over the PoE cable medium which exceeds the predetermined power level and/or preventing excessive heat build-up on the PoE cable medium.

The switching device is at least one selected from the group consisting of: jumpers, DIP switches, and any solid state device, and where circuit protection module(s) is embedded in an enclosure containing other utilities.

The switching device is a solid state device that sets the predetermined power level for the over-current and/or over-voltage circuit module via the following steps: remotely toggling preset factor power levels; after initial circuit activation, sensing the current draw of the powered device, and setting a new power level based upon the sensed current draw of the powered device.

The over-current and/or over-voltage circuit module further comprises a plurality of clamping diodes, fuses, and/or light-emitting diodes.

The cable medium circuit protection module further comprises a transceiver which transmits a signal to an external receiver when the electrical power exceeds a predetermined power level and/or when excess heat build-up on the PoE cable medium is detected.

A communication circuit protection system for protection of a PoE cable medium, the circuit protection system comprising: a power supply, a powered device, and a circuit protection module comprising an over-current and/or over-voltage circuit module and/or a heat circuit protector which measures and/or detects heat rise of the PoE cable medium, the circuit protection module further comprising a diode device that prevents a power supply from powering up a powered device until the powered device responds to a request from the power supply to identify itself, and wherein the circuit protection system is disposed between the power supply and the powered device, such that when the power supply transmits a request to the powered device, the diode device will detect a response from the powered device identifying itself and activate the circuit protection module, thereby enabling the over-current and/or over-voltage circuit module to interrupt the flow of the electrical power through the PoE cable medium when it detects (1) that the electrical power exceeds a predetermined power level of the circuit protection module set for the PoE cable medium and/or (2) excess heat build-up on the PoE cable medium, thereby prohibiting transmission of the electrical power over the PoE cable medium, wherein the over-current and/or over-voltage circuit module further comprises a switching device for setting the predetermined power level of the circuit protection module.

The diode device is a Zener diode.

A method for protecting a PoE cable medium of a communication circuit protection system, comprising: disposing, between a power supply and a powered device, a circuit protection module that comprises an over-current and/or over-voltage circuit module and/or a heat circuit protector for protection of the PoE cable medium within the circuit, the circuit protection module further comprising a diode device, sending a request from the power supply to the powered device via the circuit protection module, sending an identification response from the powered device to the power supply via the circuit protection module, detecting by the diode device that the powered device has sent the response to the power supply, and enabling the power supply to deliver electrical power to the circuit protection module and the powered device over the PoE cable medium, and interrupting the delivery of the electrical power over the PoE cable medium to the powered device if (1) the over-current and/or over-voltage circuit module determines that the electrical power from the power supply exceeds a predetermined power level and/or (2) the heat circuit protector detects excessive heat build-up in the PoE cable medium, wherein the over-current and/or over-voltage circuit module further comprises a switching device for setting the predetermined power level of the circuit protection module.

According to the circuit protection module, the over-current and/or over-voltage circuit module is a circuit board.

According to the circuit protection module, the over-current and/or over-voltage circuit module is a wall plate assembly that comprises a jack interface.

According to the circuit protection module, the circuit board comprises a plurality of clamping diodes, fuses and light-emitting diodes to set a predetermined power level for the over-current and/or over-voltage circuit module.

According to the circuit protection module, over-current and/or over-voltage circuit module can be a fusible link such as a re-settable fuse. The heat circuit protector can be a thermistor.

According to the circuit protection module, the circuit protection module can further comprise a communication jack, a transformer and a protection outlet port. Communication jack can be followed by the transformer, and over-current and/or over-voltage module and/or heat circuit protector can be disposed between transformer and protection outlet port.

According to the circuit protection module, the heat circuit protector detects a temperature change over time for a cable conductor.

According to the circuit protection module, the temperature change comprises a change induced by ambient temperature.

According to the circuit protection module, the over-current and/or over-voltage circuit module comprises at least a relay and a fuse, the relay being a primary mechanism of protection and the fuse being a secondary mechanism of protection.

According to the circuit protection module, the circuit protection module further comprises a plurality of jumpers and a plurality of DIP switches, wherein the plurality of jumpers and the plurality of DIP switches are used to set an adjustable power level of protection.

The present disclosure discloses a DC power and/or an AC power transmission circuit protection system for protection of a cabling medium. The circuit protection system comprises a power supply, a powered device, cabling medium and a circuit protection module comprising an over-current and/or over-voltage circuit module and/or a heat circuit protector. The circuit protection system is disposed between the power supply and the powered device, whereby an electrical current flows through the cabling medium and is interrupted when the over-current and/or over-voltage circuit module and/or the heat circuit protector exceeds a predetermined level.

According to the circuit protection system, the over-current and/or over-voltage circuit module is a wall plate assembly that comprises a jack interface.

According to the circuit protection system, the circuit board comprises a plurality of clamping diodes, fuses and light-emitting diodes to set a predetermined power level for the over-current and/or over-voltage circuit module.

According to the circuit protection system, over-current and/or over-voltage circuit module can be a fusible link such as a resettable fuse. Heat circuit protector can be a thermistor.

According to the circuit protection system circuit protection module can be integrated with a communication jack.

The circuit protection module can be a secondary component of a communication jack.

According to the circuit protection system, the circuit protection system can be color-coded based on power level limits of the cable medium.

According to the circuit protection system, the circuit protection system can be disposed at a centralized hub location.

According to the circuit protection system, the circuit protection module can be a transition adapter between a communication jack and the powered device.

According to the circuit protection system, the circuit protection system can further comprise an over-current and/or over-voltage limiting control point.

According to the circuit protection system, the circuit protection system can further comprise an insulation displacement connector.

According to the circuit protection system, the circuit protection system can further comprise a status indicator indicating status of available current.

The present disclosure discloses a method of protection of cabling medium of a DC power and/or an AC power transmission circuit. The method can comprise the following steps of (a) disposing a circuit protection module that comprises an over-current and/or over-voltage circuit module and/or a heat circuit protector for protection of the cabling medium within the circuit, and (b) interrupting the circuit when over-current and/or over-voltage circuit module and/or heat circuit protector exceeds a predetermined level.

BRIEF DESCRIPTION OF THE DRAWINGS

FIG. 3B-a is a detailed view of the left side of the diagram of FIG. 3B.

FIG. 3B-b is a detailed view of the right side of the diagram of FIG. 3B.

FIG. 3D is a diagram of the smart conductor interrupt control module of FIG. 3C.

FIG. 3D-a is a detailed view of the left upper corner of the diagram of FIG. 3D.

FIG. 3D-b is a detailed view of the right upper corner of the diagram of FIG. 3D.

FIG. 3D-c is a detailed view of the left lower corner of the diagram of FIG. 3D.

FIG. 3D-d is a detailed view of the right lower corner of the diagram of FIG. 3D.

FIG. 3D-e is the diagram of the smart conductor interrupt control module shown in FIG. 3D showing the DIP switches 301 according to an embodiment of the present disclosure.

FIG. 3D-f is a diagram of the smart conductor interrupt control module shown in FIG. 3D showing the jumpers 303 according to an embodiment of the present disclosure.

FIG. 3D-g is a diagram of the smart conductor interrupt control module shown in FIG. 3D showing a combination of DIP switches 301 and jumper 303 according to an embodiment of the present disclosure.

FIG. 3D-h is a diagram of the smart conductor interrupt control module shown in FIG. 3D showing a solid state switching device 305 according to another embodiment of the present disclosure.

FIG. 3E is a table that describes the components of the smart conductor interrupt control module of FIG. 3C.

FIG. 12 is a flow diagram depicting the basic circuit with a DIP switch according to an embodiment of the present disclosure.

FIG. 13 is a flow diagram depicting the basic circuit with a solid state switch according to yet another embodiment of the present disclosure.

FIG. 14 is a flow diagram depicting the power supply equipment (PSE) querying for power level demand.

FIG. 15 is a flow diagram depicting the power supply equipment of FIG. 14 querying the power level demand and a response from a powered device.

FIG. 16 is a flow diagram depicting the energy flow from the power supply equipment through the Zener Diode and protection circuit to the powered device.

DETAILED DESCRIPTION OF THE PREFERRED EMBODIMENTS

Figure 1:
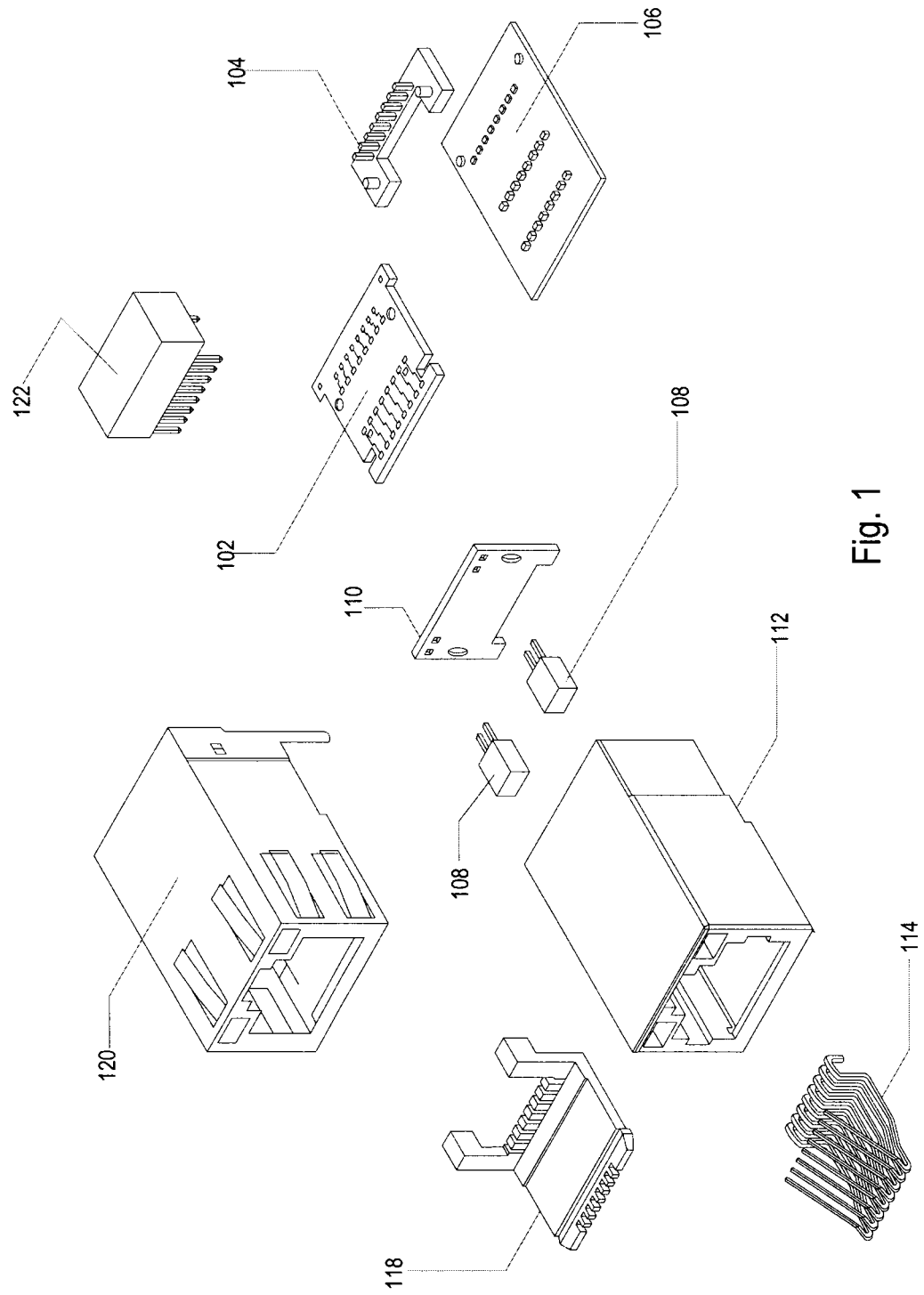
FIGS. 1, 1A, 1B and 2 are exploded views of a circuit protection system according to the present disclosure.
Figure 2:
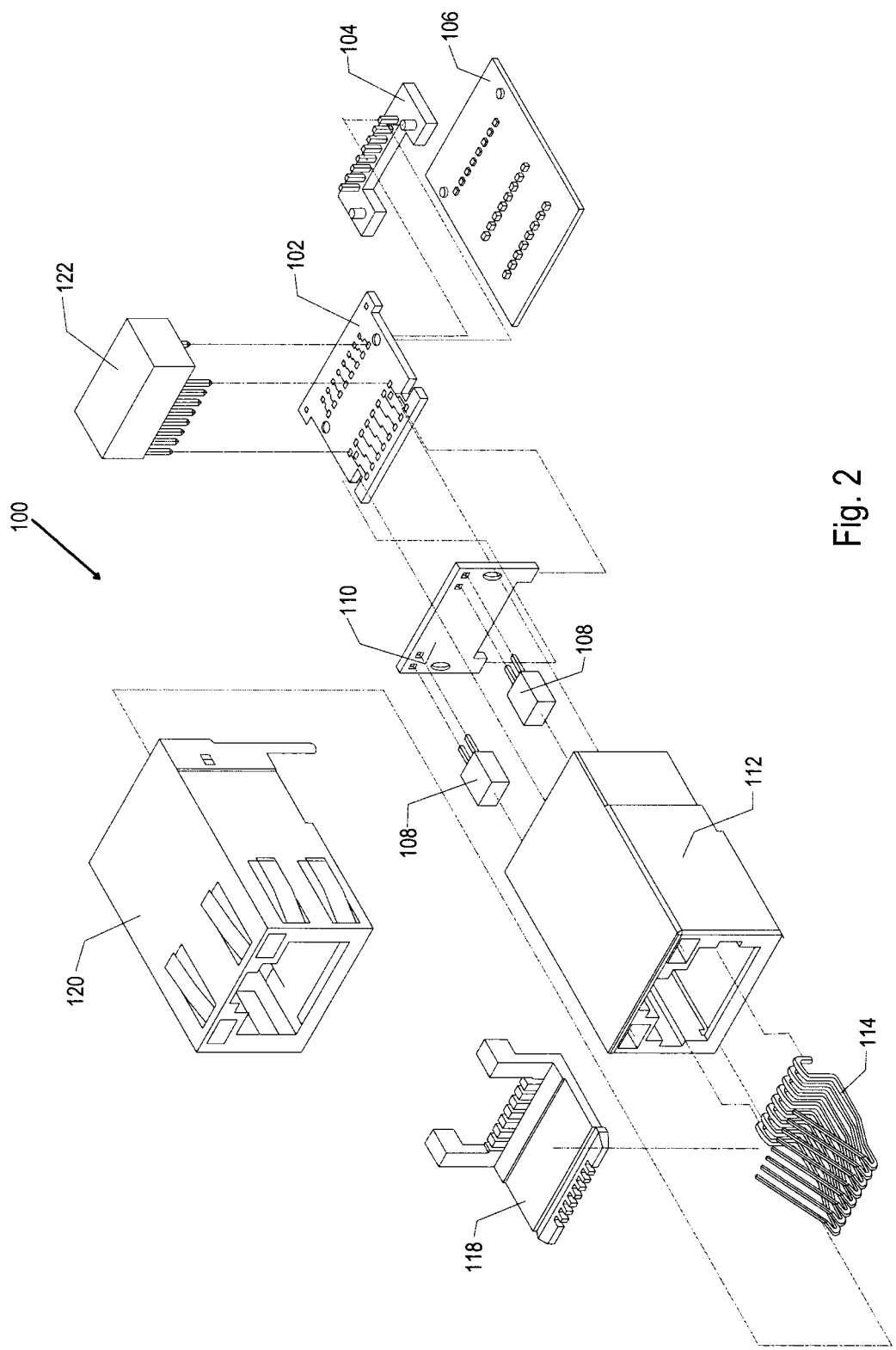

FIGS. 1 and 2 depict an exploded view of a circuit protection system according to the present disclosure.

In FIG. 1, a circuit protection system 100 comprises a PC board assembly 102, an Insulation Displacement Connector (IDC) assembly 104 that can terminate cable conductors, two status led indictors 108, a LED mounting board 110, an internal component housing 112, a Contact Tine Assembly 114 that provides the physical contact point for the associated mating plug, a Contact Tine Assembly holder 118, a housing 120 and a circuit protection module 122.

Figure 1A:
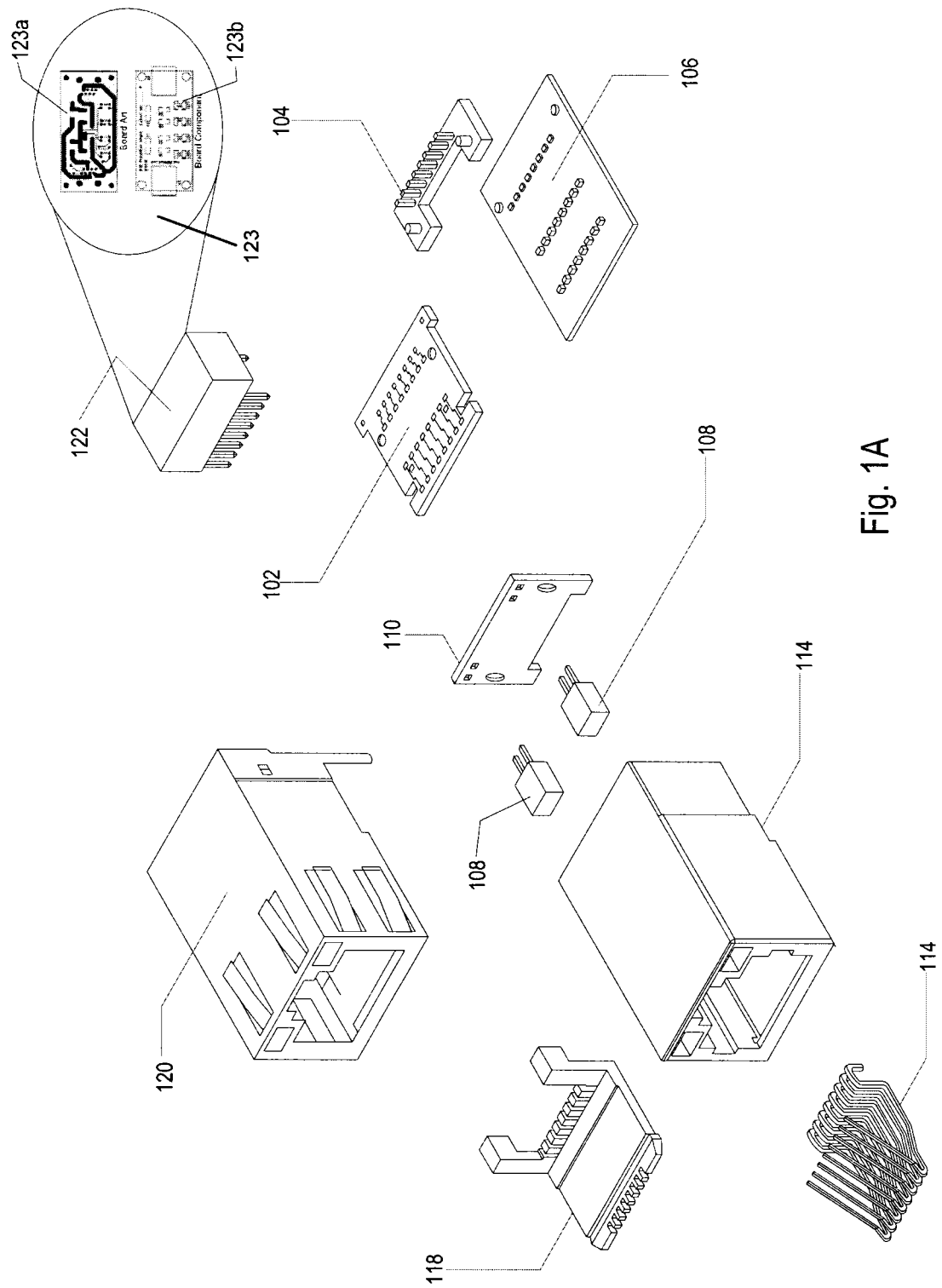

In FIG. 1A, the circuit protection module 122 includes a simple conductor interrupt control module (CICM) 123. Simple CICM 123 includes a board art diagram 123a and a board component diagram 123b. Board component diagram 123b for simple CICM 123 are described in FIGS. 3B, 3B-a and 3B-b.

Figure 1B:
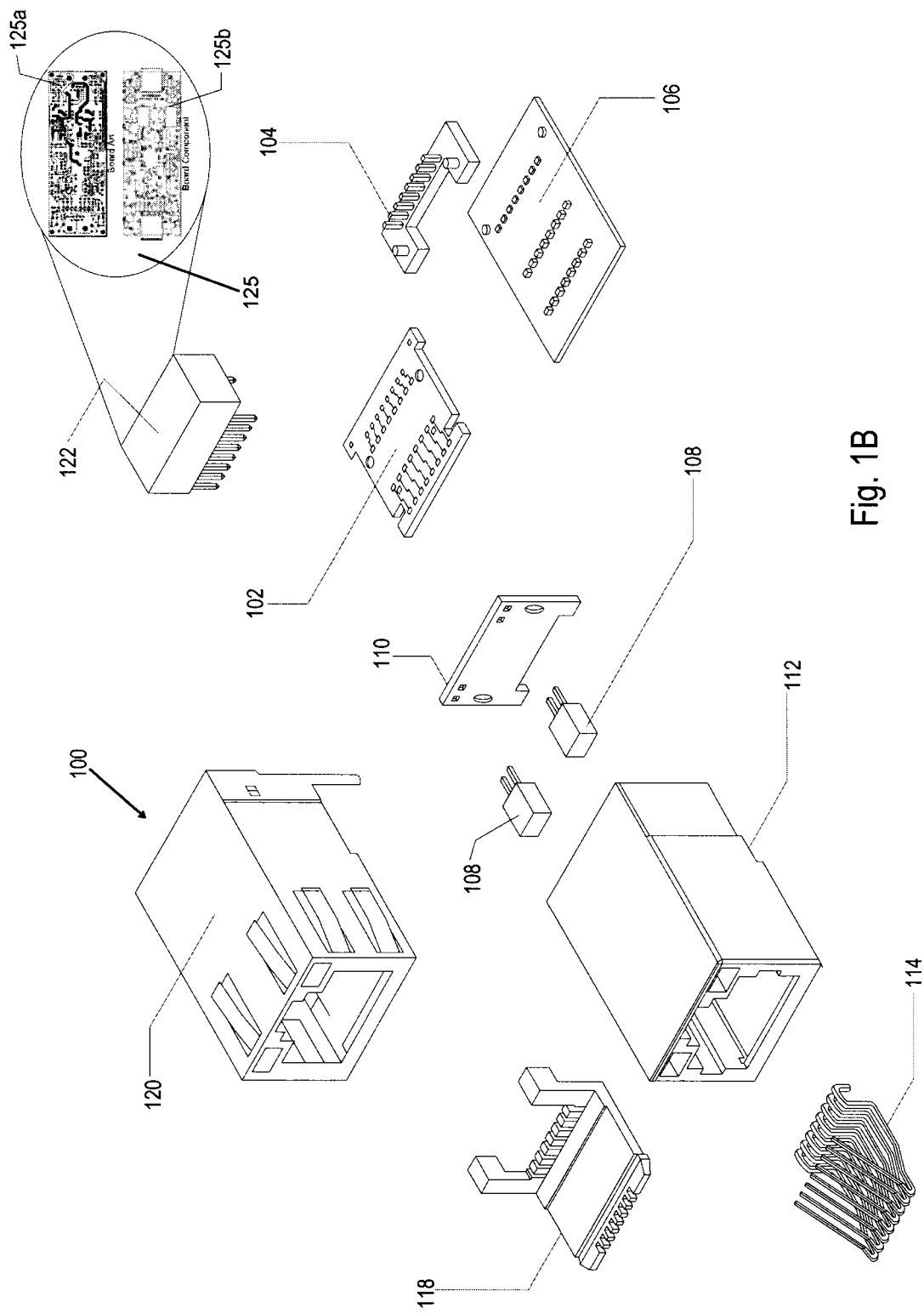

In FIG. 1B, circuit protection module 122 includes a smart CICM 125. Smart CICM 125 includes a board art diagram 125a and a board component diagram 125b. Board component diagram 125b for smart CICM 125 is described in FIGS. 3C, 3D, 3D-a, 3D-b, 3D-c, and 3D-d.

FIG. 2 describes the procedures of assembling a circuit protection system. In FIG. 2, circuit protection module 122 is mounted on top of a PC board assembly 102. PC board assembly 102 is then mounted with IDC Assembly 104. IDC assembly 104 is seated on top of an assembly base 106. Two status led indicators 108 are installed with mounting board 110 that can show the status of the available current in a circuit. The mounting board 110 can be a right cover plate of internal component housing 112. IDC assembly 104, together with assembly base 106, and Contact Tine Assembly 114 with holder 118 is located inside internal component housing 112. Internal component housing 112 is assembled properly inside housing 120.

Figure 3:
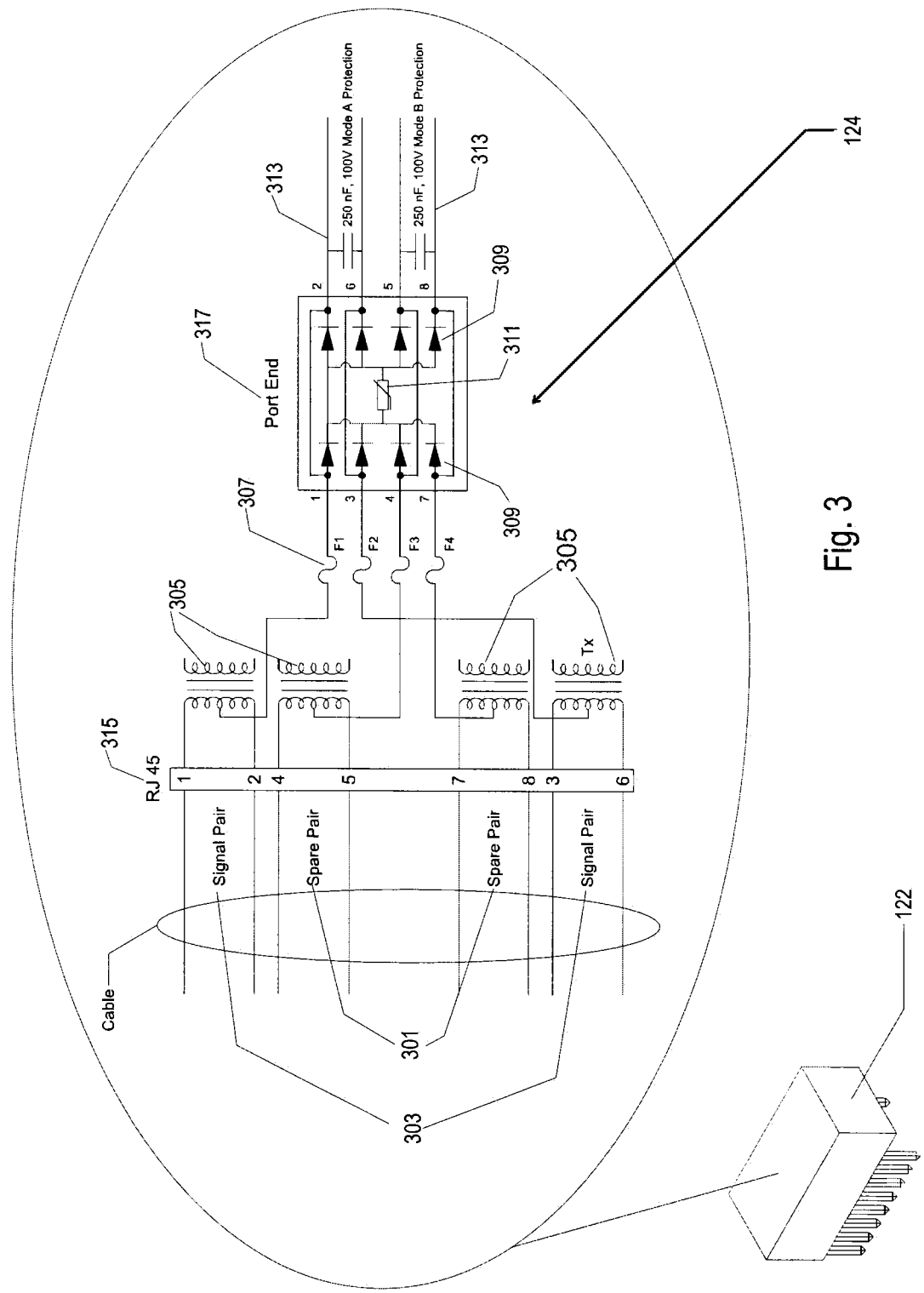
FIG. 3 is a schematic representation of a circuit protection module according to the present disclosure.

FIG. 3 is a schematic representation of a circuit protection module according to the present disclosure. Circuit protection module 122 has an embodiment 124 different from simple CICM 123 and smart CICM 125. The embodiment 124 of circuit protection module 122 comprises a RJ communication jack 315, a cable medium 302, four transformers 305, four over-current and/or over-voltage circuit breakers 307, a port end portion 317 and two protection ports 313. RJ45 communication jack 315 has two signal pairs 303 and two spare pairs 301 that can be utilized if necessary. Four pairs of the RJ45 communication jack 315 are connected with four transformers 305 respectively. Transformers 305 are connected with four over-current and/or over-voltage circuit breakers 307, which are named as F1, F2, F3 and F4. In one embodiment, an over-current and/or over-voltage circuit breaker can be a fusible link. Fusible link may be implemented as a direct fuse or be incorporated as a resettable circuit protection system. Conductors 1 and 2 correspond to F1, conductors 4 and 5 correspond to F3, conductors 7 and 8 correspond to F4, and conductors 3 and 6 correspond to F2. Over-current and/or over-voltage circuit breakers 307 are for voltage protection and have a threshold of voltage or current. The threshold can be pre-determined. When the voltage or current in conductor 301 is higher than the threshold of over-current and/or over-voltage circuit breakers 307, over-current and/or over-voltage circuit breakers 307 will disconnect the circuit. Port end 317 comprises a diagram 309 that represents a flow diagram of the circuit and a heat circuit protector 311 for thermal circuit protection. In one embodiment, heat circuit protector 311 can be a thermistor. Heat circuit protector 311 can protect materials of the cable medium from overheating and melting. Normally jacketing material is designed for 60° C., 75° C. or 90° C. The increase in heat can cause a vastly increased rise in temperature as discussed above. Heat circuit protector 311 will disconnect the circuit when temperature is higher than a pre-determined threshold. Accordingly, circuit module 124 has two mechanisms of protection implemented thereby. One is the over-voltage and over-current protection by over-current and/or over-voltage circuit breaker 307 and the other is heat protection by heat circuit protector 311.

In the technology known as PoE, currently there is no external physical layer method available for protecting the cable medium, and there is no protection system available for a system-wide communication circuit power network. Current communication systems utilizing powering technologies such as PoE systems can transmit power up to 15 watts, and can transmit power up to 30 watts for PoE+ systems. New emerging technologies such as PoE++ and others can have the capability of presenting power up to 200 watts or more. The present disclosure is suitable to protect any circuit where the communication network (including communication cables) is utilized as the power transmission medium. Further, the present disclosure can be designed to meet the increased power capabilities as the codes and standards become ratified.

The circuit protection module 122 has another two different embodiments. One embodiment of the circuit protection module 122 has simple CICM 123, and the other embodiment of the circuit protection module 122 has smart CICM 125. Specifically, simple CICM 123 has the simple circuit board 123*b*, and smart CICM 125 has the smart circuit board 125*b*. The detailed descriptions of simple CICM 123 and smart CICM 125 are described in FIGS. 3B and 3D, respectively.

Figure 3A:
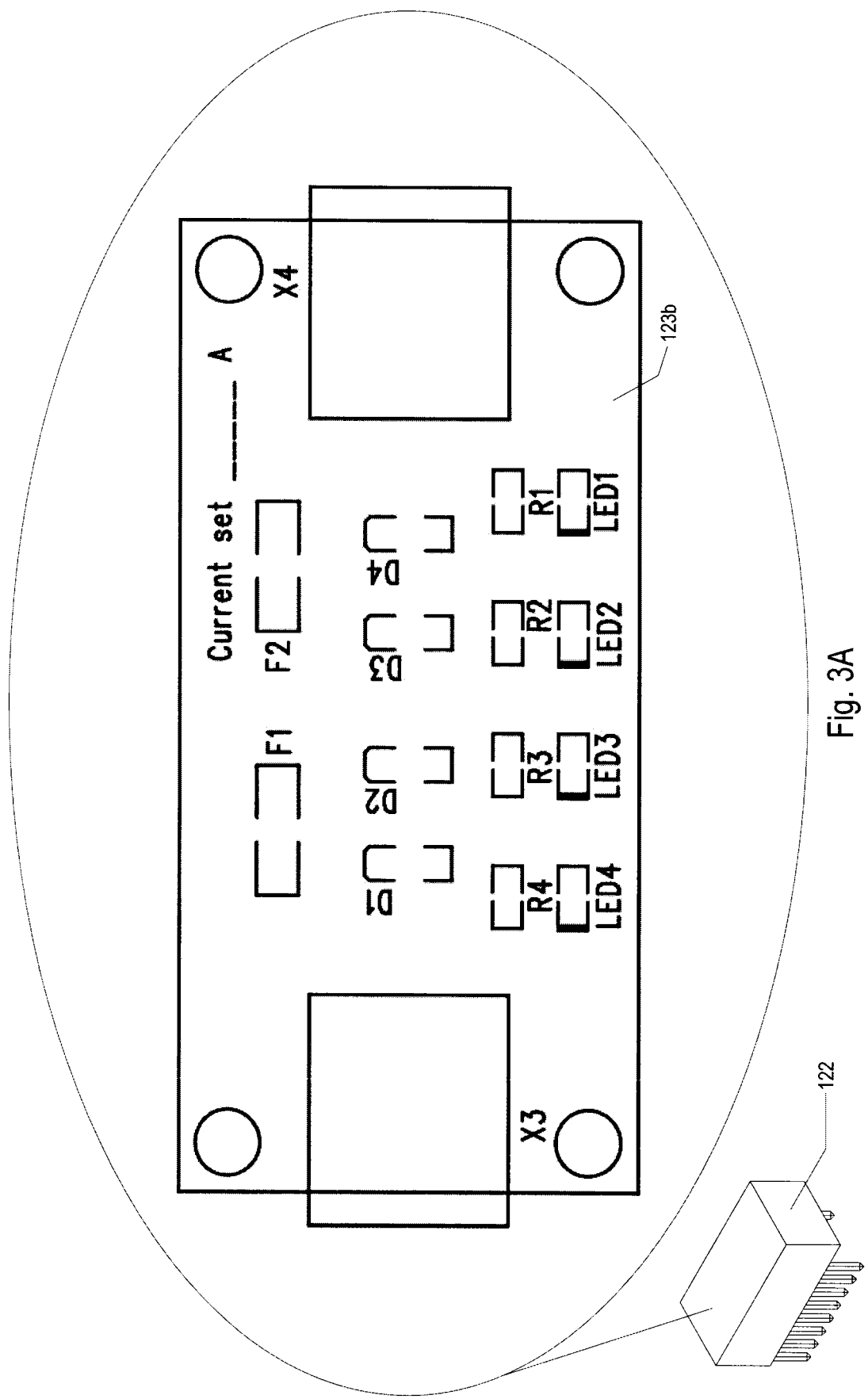
FIG. 3A is a board component diagram of a simple circuit protection module according to the present disclosure.

Referring to FIG. 3A, simple circuit board 123*b* utilizes a combination of resistors ("R"), fuses ("F") and clamping diodes ("D") to set predetermined thresholds of voltage and amperage to protect each of the individual wire conductors as defined by simple CICM 123.

An individual wire conductor corresponds to a contact of the eight positions of the RJ45 jack. For example, in FIG. 3A, X3 and X4 correspond to two contacts of the eight positions of the RJ45. When an individual wire conductor exceeds the voltage and current limits set by the corresponding clamping diodes D1-D4 and fuses F1 and F2, simple CICM 123*b* will be shut down to protect the individual wire conductors that have exceeded the voltage and current limits, and thus protect cabling medium from overheating, which may result in a potential fire or safety hazard.

When over-voltage and over-current happen to an individual wire conductor in simple CICM 123, one of four light emitting diodes (LEDs) 1-4 can provide a visual indication to indicate the fault status of the conductor. Specifically, one of LEDs 1-4 will, e.g., deactivate when one of fuses F1 and F2 fails.

The upper current limits of fuse F1 or F2 in simple CICM 123 can be adjusted, so fuse F1 or F2 sets the thresholds of each contact of the RJ45 jack. The threshold can be identified by the color-coding of the RJ45 jack, as described in FIG. 8. For example, as described in FIG. 8, the color of the RJ45 jack can be green, purple or yellow representing different power thresholds.

Fuses F1 and F2 set the upper current limit, and thus the power level, of simple CICM 123. As the power that is drawn through the cables, which are connected with simple CICM 123, increases, the current rises to a certain level and then remains constant. If the current is below the rating of fuse F1 or F2, the contact between the cables and simple CICM 123 is maintained and the electrical current continues to flow through simple CICM 123. As the current and the power increase, fuse F1 or F2 will begin to get heated, and eventually the internal link of fuse F1 or F2 will open and disconnect the power from the end device that is connected with simple CICM 123. The time to open the link is dependent on the fuse rating and the level of current drawn through the cabling medium that is connected with simple CICM 123.

Optionally, a thermistor is utilized to detect a temperature rise that correlates with a resistance increase or change of a cable conductor when the temperature is over and above a normal working condition. In one embodiment, the thermistor can be located in the overcurrent and/or over-voltage circuit. A temperature increase of the cable conductor creates a resistance increase in the cable conductor. The thermistor detects and converts the resistance increase to a voltage output through the Steinhart-Hart equation. The voltage output is added to the existing circuit voltage. Accordingly, the circuit protection module or the circuit protection system of the present disclosure can detect the temperature change over time, including ambient temperature change and a real-time temperature increase over time for the cable conductor. For example, when the temperature of the cable conductor is changed due to a different ambient temperature, the temperature causes the resistance change. The thermistor converts the change in resistance to a voltage output. Again, the voltage output is added to the existing circuit voltage.

When this overall (combined) voltage exceeds a set threshold of the CICM, a fuse or a relay will activate and shut down the over-voltage and/or overcurrent circuit.

Figure 3B:
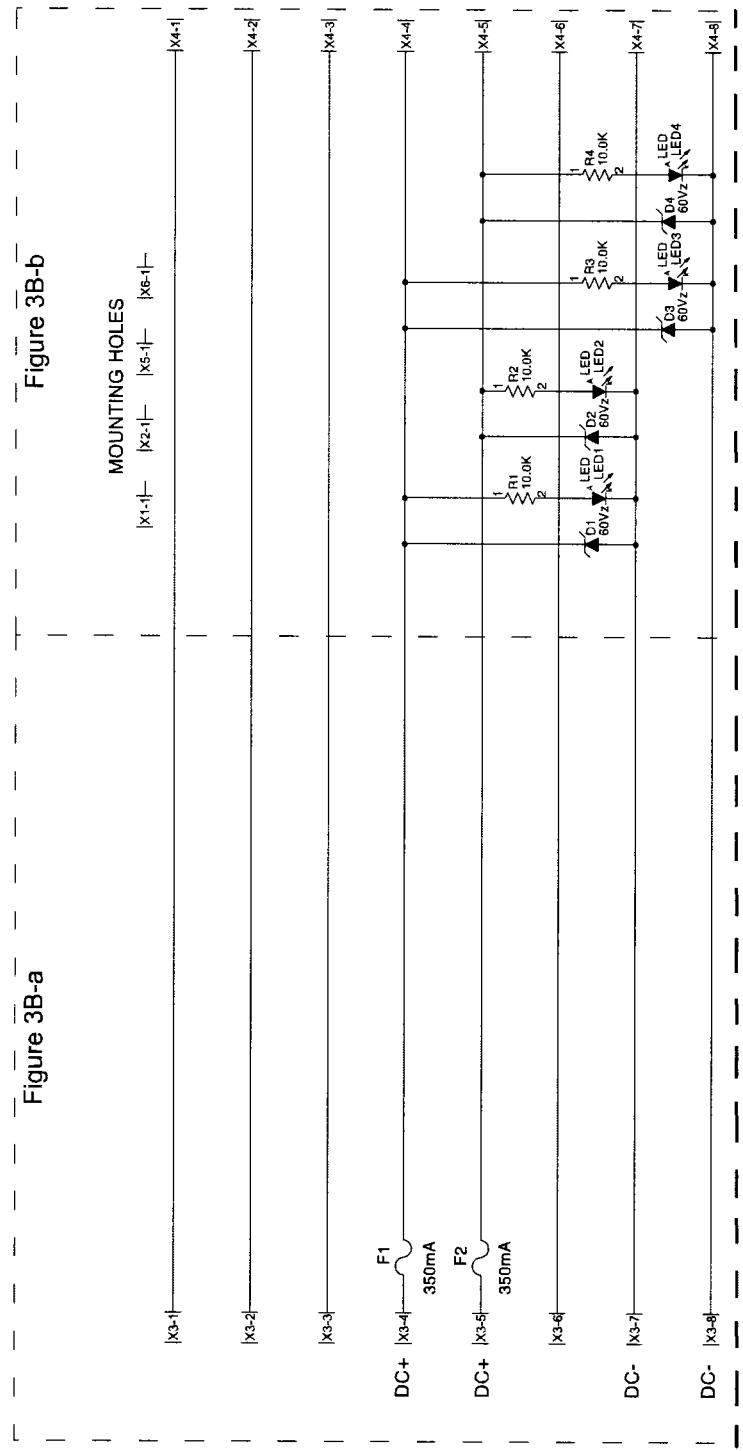
FIG. 3B is a diagram of the simple conductor interrupt control module of FIG. 3A.

In FIGS. 3B, 3B-a, and 3B-b, simple CICM 123 has two fuses F1 and F2, four over-voltage transient-voltage-suppression (TVS) protection diodes D1-D4, four resistors R1-R4, and four LEDs 1-4. X1-1, X2-1, X5-1, and X6-1 correspond to mounting holes of simple CICM 123.

In FIG. 3B, there are two parallel paths to deliver power to the end device, the rating of each fuse F1 or F2 is a half of the total power. For example, in FIG. 3B-a, the current of fuse F1 is 350 milliampere (mA) and the current of fuse F2 is also 350 mA. Theoretically, the circuit of simple CICM 123 is relatively balanced and the current through each fuse F1 or F2 are equal. However, when there is an imbalance due to poor connections, a higher current will be drawn through one pair and the fuse with the higher current will eventually open. When the fuse with the higher current is open, the remaining one path of two parallel paths will then be relied upon to draw the full amount of power. As a result, the second fuse will then open in a short period, as its rating will be exceeded by a factor of two.

Protection diodes D1-D4 are rated not to conduct current when the nominal voltage is present across the cabling medium. When there is an excessive voltage applied or a spike in voltage that reaches the threshold voltage of diodes D1-D4 in simple CICM 123, diodes D1-D4 maintain the voltage at that level, and diodes D1-D4 start to conduct the current. In a situation when there is a transient spike in voltage, diodes D1-D4 will conduct the current for a short period, which may not open the fuses. However, when there is a constant excessive voltage through simple CICM 123, diodes D1-D4 will draw a large current, and fuses F1 and F2 will open.

If a unidirectional diode is utilized, the polarity of the voltage supply needs to be correct, or the diode will conduct at a low voltage and provide reverse polarity protection. If a bidirectional diode is utilized, the voltage that passes through the bidirectional diode can be of either polarity or an AC voltage.

LEDs 1-4 indicate the status on whether the power is being passed to the end device. LEDs 1-4 will be illuminated when the power is applied and the fuses are not opened. If an individual line is open, two LEDs will be on and the other two LEDs will be off. Accordingly, the LEDs can be utilized as a tool to identify the line that is opened. For example, referring to FIGS. 3B and 3B-a, and 3B-b, when one positive DC power of pin 4 is open on the input, then LED 1 and LED 3 will have no power while LED 2 and LED 4 will remain on. If one negative DC power of pin 7 is open, LEDs 1 and 2 will be off, and LEDs 3 and 4 are on.

When two lines are open, no matter whether two lines are two positive lines pins 4 and 5 or two negative lines pins 7 and 8, all four LEDs will be off. Opening one positive line and one negative line will extinguish three of the four LEDs. For example, if pin 4 and pin 7 are opened on the input side, voltage will only be applied to LED 4 while LEDs 1, 2 and 3 will be off.

LEDs 1-4 and diodes 1-4 are bidirectional for usage of AC voltages. When LEDs 1-4 are green in both directions, LEDs 1-4 are on at their full brightness indicating that the power is passed through. If the LED has a pair of green and red illuminations, that is, one direction is green and the other direction is red, LEDs 1-4 can show the status on whether power is present, and also show the status of the polarity of the voltage. In one voltage polarity, the green part of the green and red pair of LEDs 1-4 is lit only. In the reversed polarity, only the red part of the green and red pair LED is lit. If an AC voltage is present on the DC circuit, then for the half of the time, the green part will be on, and for the other half of the time, the red part will be on, giving an orange appearance.

Referring to FIGS. 3B, 3B-a, and 3B-b, if any one line draws a current more than the rated current of fuses F1 and F2, fuses F1 and F2 will blow. If fuse F1 or F2 blows, then two LEDs will extinguish, and power to the line is interrupted. If the voltage of any line exceeds the clamp diode value of the diodes 1-4, diodes 1-4 will draw current and blow the fuse that the diode is tied to. As discussed above, LEDs 1-4 can be a red and green pair to indicate the polarity errors.

Fuse values of fuses F1 and F2 depend on the voltage supply and the desired power limit. The power of fuses F1 and F2 can be:

$$0.35 \text{ A per leg} \times 2 \times 48 \text{ V} = 33.6 \text{ watts} \quad \text{Equation (1)}$$

$$0.625 \text{ A per leg} \times 2 \times 48 \text{ V} = 60 \text{ watts} \quad \text{Equation (2)}$$

$$1.0 \text{ A per leg} \times 2 \times 48 \text{ V} = 96 \text{ watts} \quad \text{Equation (3)}$$

Figure 3C:
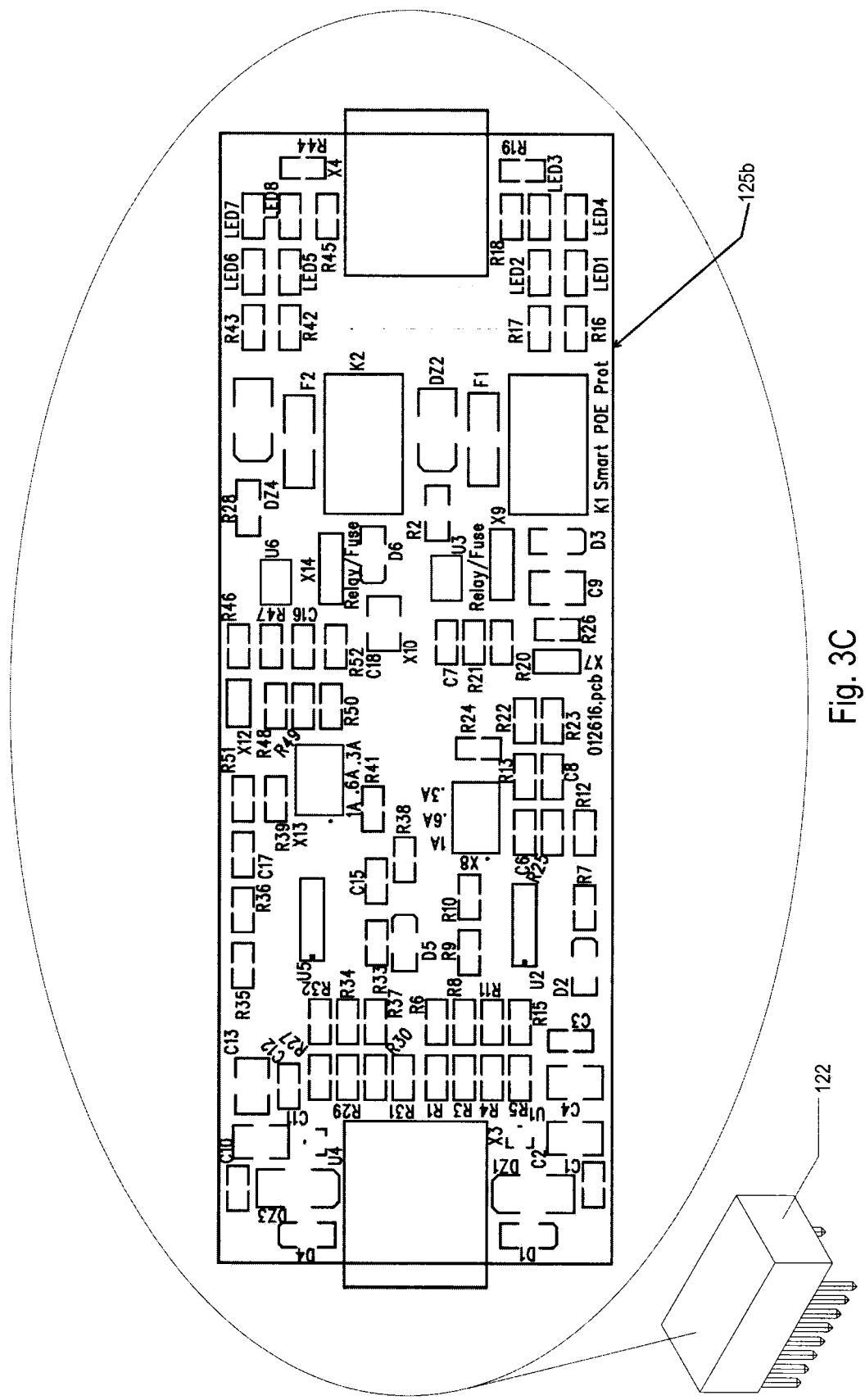
FIG. 3C is a board component diagram of a smart conductor interrupt control module of FIG. 3B.

FIG. 3C is a board component diagram of smart CICM 125b. Different from simple CICM 123b, smart CICM 125b allows a predefined set point to be established by utilizing a combination of fuses and relays. The predefined set points are determined by the jumpers (i.e., X8 and X13) and fuses or relays installed and activated by the jumpers (i.e., X9 and X14).

In the smart circuit, LEDs 1-8 are utilized as visual indications to provide a progressive measurement of the level of protection of the conductor. A percentage of the predefined threshold is indicated by the color changes of LEDs 1-8. This percentage may be adjusted to meet different requirements of smart CICM 125b.

Utilizing the relay option (i.e., K1 and K2) to activate smart CICM 125b can reset the direct current (DC) power after a fault is corrected on an individual wire connector.

Both a relay and a fuse are indicated in the embodiment of smart CICM 125b. It is noted that the electrical structure of the present embodiment allows the relay to act as a primary mechanism of protection. When an incident occurs and the relay malfunctions or becomes damaged, a fuse will then act as a secondary mechanism of protection (i.e., a second order of magnitude) to protect and disable the overcurrent and/or over-voltage circuit.

In smart CICM 125b, two fuses F1 and F2 and two transient-voltage-suppression (TVS) diodes can be utilized to provide protection to the end device being powered. Smart CICM 125b uses an indication of the relative power level being drawn by the end device through several LEDs. The sensing of the current can be utilized to operate a relay to disengage power to the end device and allow for resetting the unit after the fault is cleared. In the circuit of smart CICM 125b, the option is either the fuse or the relay, but it can be rearranged so the relay will provide active protection while the fuse provides a failsafe link in series with the relay contact.

Figure 3D:
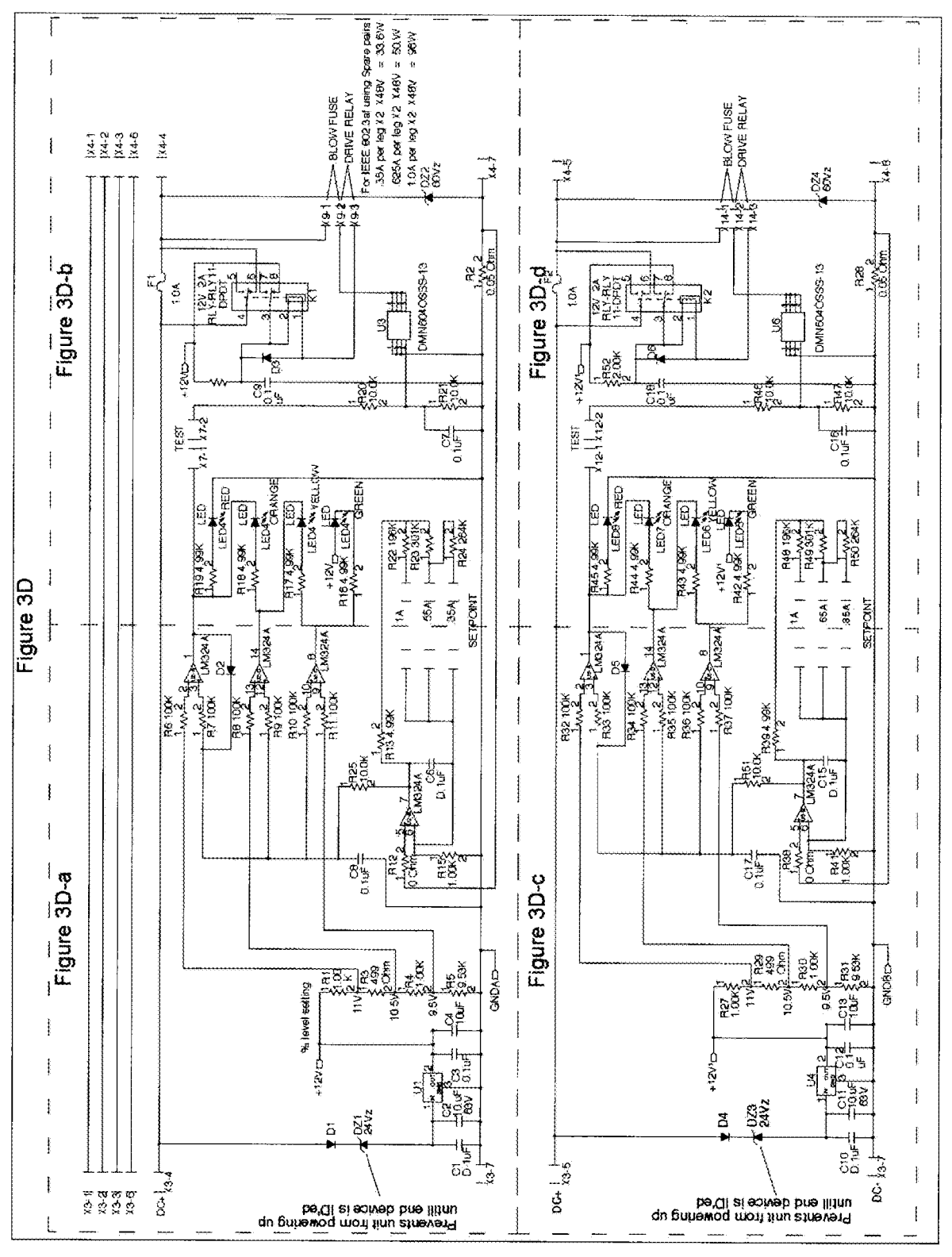

Two mirrored circuits are utilized for each of the DC pairs in one embodiment of the present disclosure, as shown in FIG. 3D. Specifically, the upper circuit is between pin 4 and pin 7, and the lower circuit is between pin 5 and pin 8. The components of the circuit from pin 5 to pin 8 are described in FIGS. 3D-c and 3D-d. The components of the mirrored circuit from pin 4 to 7 are similar to the components in FIGS.

3D-c and 3D-d. Accordingly, the descriptions for FIGS. 3D-a and 3D-b are not included.

In FIGS. 3D, 3D-c and 3D-d, there is the local power supply in use for the lower circuit. A simple linear direct current (DC) regulator includes D4, DZ3, U4, C10, C11, C12 and C13. The descriptions of the components of smart CICM 125 have been described in FIGS. 3D-c, 3D-d, and 3E. For example, C10, C11, C12, and C13 are capacitors with various capacitances. A more sophisticated supply can be utilized if necessary. These components provide a 12 volts (V) DC power source for the lower circuit of smart CICM 125, and the 12 V DC power source is utilized for reference voltages associated with four resistors R27, R29, R30 and R31. The reference voltages are for current measurements and indication. High conductance fast diode D4 provides for reverse polarity protection while DZ3 is utilized to delay powering the lower circuit. If the centralized point (hub) is utilized to identify the end device being powered, the draw of this circuit can interfere with that process. Since a lower voltage is utilized to probe for the end device, the forward drop of DZ3 will not pass the current to the supply and circuit until after that process is complete. Once the higher voltage is present, DZ3 conducts the current and the lower circuit becomes active.

Current sensing is accomplished by R28 and U5-B. Setting the gain of the circuit and the power level of the circuit is via X13 select jumper. Lower gain settings allow for higher current and power levels, so only one of the three possible jumpers is to be utilized.

The jumper manipulation and/or activation can be accomplished in a number of different ways including both physical manipulation and electrical routing or activation. One embodiment utilizes a dual inline package (DIP) switch in line with legs of the jumper. Dependent on the combination of the DIP switch toggles, various combinations of jumpers can be inserted or excluded from the overcurrent and/or overvoltage circuit. If smart CICM 125b has the capability of being set to various threshold levels, then the on or off position of the DIP switch toggles can dictate the maximum CICM voltage thresholds specific to application. For example, 75 watts power level may be represented with a toggle 1 as "on", a toggle 2 as "off", and a toggle 3 as "off". Smart CICM 125b can then be reconfigured to a higher power threshold by use of a different combination of toggle positions. For example, 100 watts may be represented with toggle 1 as "off", toggle 2 as "on" and toggle 3 as "off".

The jumper manipulation and/or activation can be accomplished in a number of different ways including both physical manipulation and electrical routing or activation. On embodiment utilizes a dual inline package (DIP) switch in line with legs of the jumper. Dependent on the combination of the DIP switch toggles 301, various combinations of jumpers 303 can be inserted or excluded from the overcurrent and/or overvoltage circuit. If smart CICM 125 has the capability of being set to various threshold levels, then the on or off position of the DIP switch toggles 301 can dictate the maximum CICM voltage thresholds specific to the application. For example, a 75 watts power level may be represented with a toggle 1 as "on", a toggle 2 as "off", and a toggle 3 as "off". Smart CICM 125 can then be reconfigured to a higher power threshold by use of a different combination of toggle positions. For example, 100 watts may be represented with toggle 1 as "off", toggle 2 as "on" and toggle 3 as "off".

FIG. 3D-h is a solid state hardware device which is used in place of DIP switch toggles 301 or jumpers 303 to set a predetermined power level for the over-current and/or overvoltage circuit module.

The voltage developed by U5-B is sent to the inputs of U5-C, U5-D, and U5-A and is compared to the reference voltages, as shown in FIG. 3D-c. As the current signal level rises, the outputs of these comparators will switch polarity and change the indicators of the LEDs being illuminated. The combination of the amplifier gain (X-13) and the reference voltages determine the point at which one of the LEDs will be lit.

Specifically, in this embodiment of the present disclosure, the current values are set to have the green LED lit until the current is at ~95% of X13 setting (under normal operation). As the current is above 95%, the green LED will be off, and the yellow LED is then lit (maximum power reached) up to 105%. When the current rises above 105%, the orange LED then is on, which warns that the lower circuit trips imminently.

Upon reaching 110% of the set current, the red LED is lit and latched on via D5. This state will be maintained until the lower circuit is powered down and allowed to reset. The same output that drives the red LED also powers a switch U6.

If jumper X14 is jumped from pin 1 to pin 2, and fuse F2 is installed, the switch will short or crowbar the output and blow fuse F2. This is a onetime operation, as fuse F2 requires a replacement to have the power pass to the output.

If jumper X14 is jumped from pin 2 to pin 3, and relay K2 is installed, switch U6 will drive the relay and open the lower circuit to the end device through relay pins 4 and 6. This is a resettable condition as powering the unit down will reclose the relay contacts and close the circuit. When relay K2 is driven from pins 8 to 3, R52 is utilized to lower power in the relay once the circuit is activated.

In an instance when F2 is not present, an overvoltage can be utilized to shut off the lower circuit. If DZ4 begins to conduct the current, sense resistor R28 will develop a voltage, and the signal will pass and shut off the lower circuit.

Figure 4:
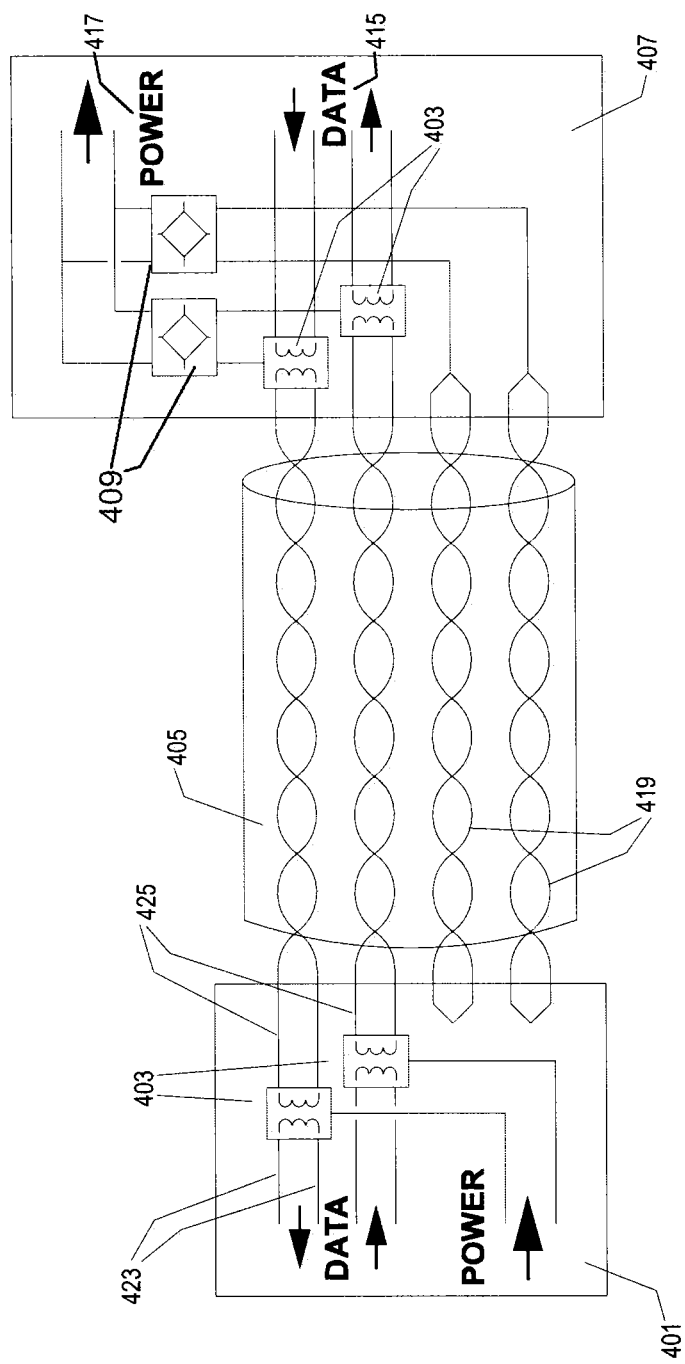
FIG. 4 is a schematic representation of a wiring circuit for a PoE ready device.

FIG. 4 is a schematic representation of a wiring circuit for a PoE ready device. FIG. 4 shows a standard approach to a PoE circuit without a circuit protection system disclosed in the present disclosure. FIG. 4 presents a common configuration of a PoE ready device connected to a PoE end device. Wiring circuit 400 includes PoE power sourcing equipment (PSE) 401, transmission portion 405 and end device 407. PSE 401 comprises transformers 403, data 411, inlet power 413, conductors 423 before transformers 403 and conductors 425 after transformers 403. Transmission portion 405 (cable) comprises conductors 419 and conductors 421. End device 407 comprising bridges 409, outlet power 417, data 415 and transformers 403.

A circuit protection system of the present disclosure can be placed in different locations of the protected circuits.

Figure 5:
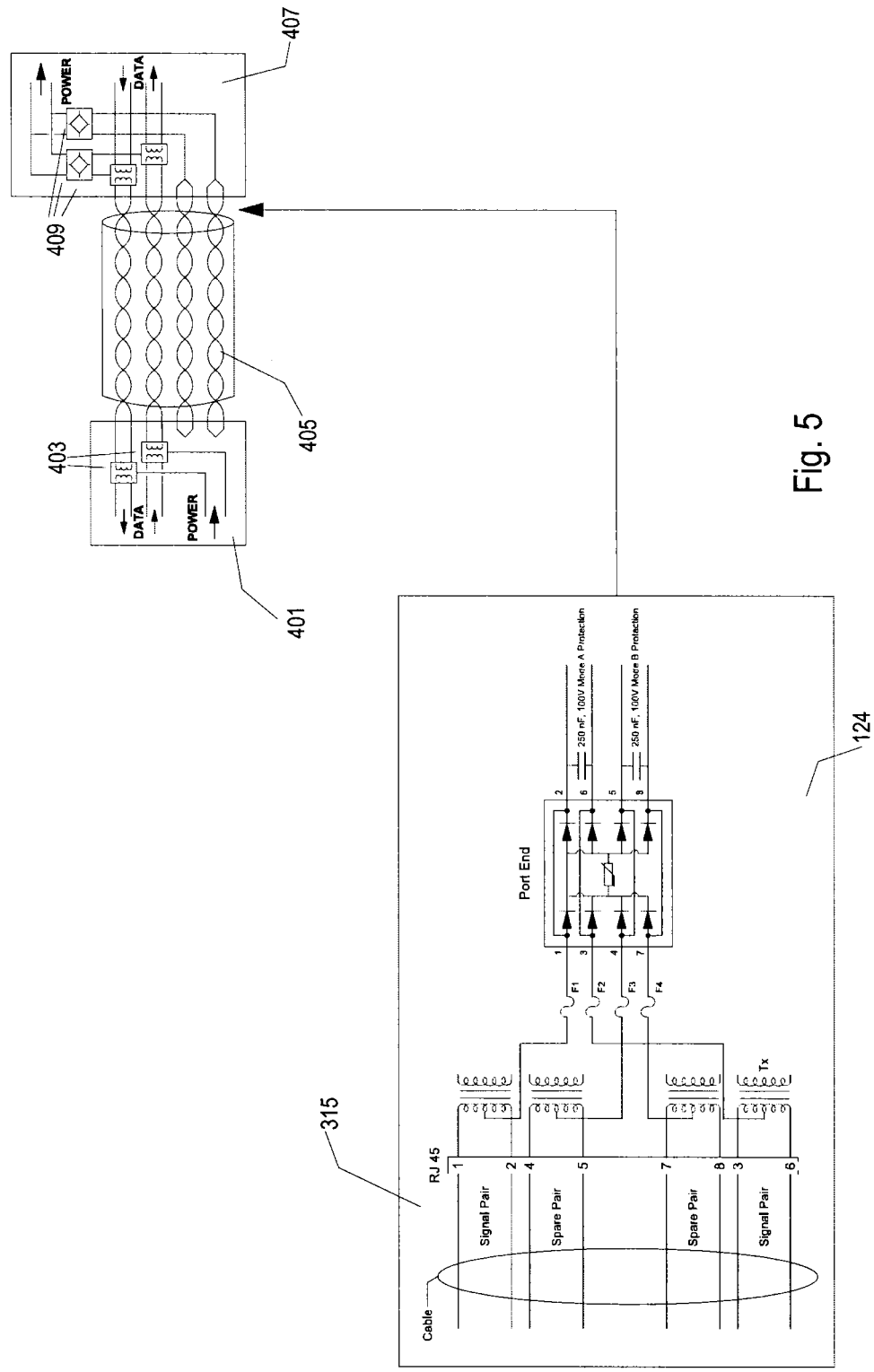
FIG. 5 is a schematic representation of a circuit protection system in a wiring circuit for a PoE ready device.

One embodiment of the system is to directly protect the end device by locating the circuit protection system at the outlet. FIG. 5 is a schematic representation of a circuit protection system in a wiring circuit for a PoE ready device, and is a representation of a possible location of the circuit protection system within the communication permanent link circuit. In this embodiment, circuit protection system 100 is located at the work area outlet of end device 407. The embodiment can have the conductors of the cable terminated in the rear of the wall plate on IDC assembly 104 of circuit protection system 100. A patch cord (or similar means) may be utilized for connectivity between the wall plate RJ45 jack and powered device equipment RJ45 jack.

In FIG. 5, a circuit protection system 100 comprises circuit module 124, which is placed before end device 407. Wiring circuit 400 for a PoE ready device in FIG. 5 has been described in FIG. 4 and circuit module 124 has been described in FIG. 3. Therefore, explanation for wiring circuit 400 and circuit module 124 is omitted.

Further, communication cabling medium protection can be achieved by building a circuit protection system directly into the circuit board that is currently located directly in a physical jack such as simple CICM 123 and smart CICM 125. Physical jack includes, but not limited to, RJ45 communication jack 315, as shown in FIGS. 3 and 5.

A secondary or primary circuit board with a circuit protection system can also be located alongside the communication jacks in an integral manner or as a child/parent unit added as a secondary component such as behind the communications wall plate, as shown in FIG. 5.

Figure 6:
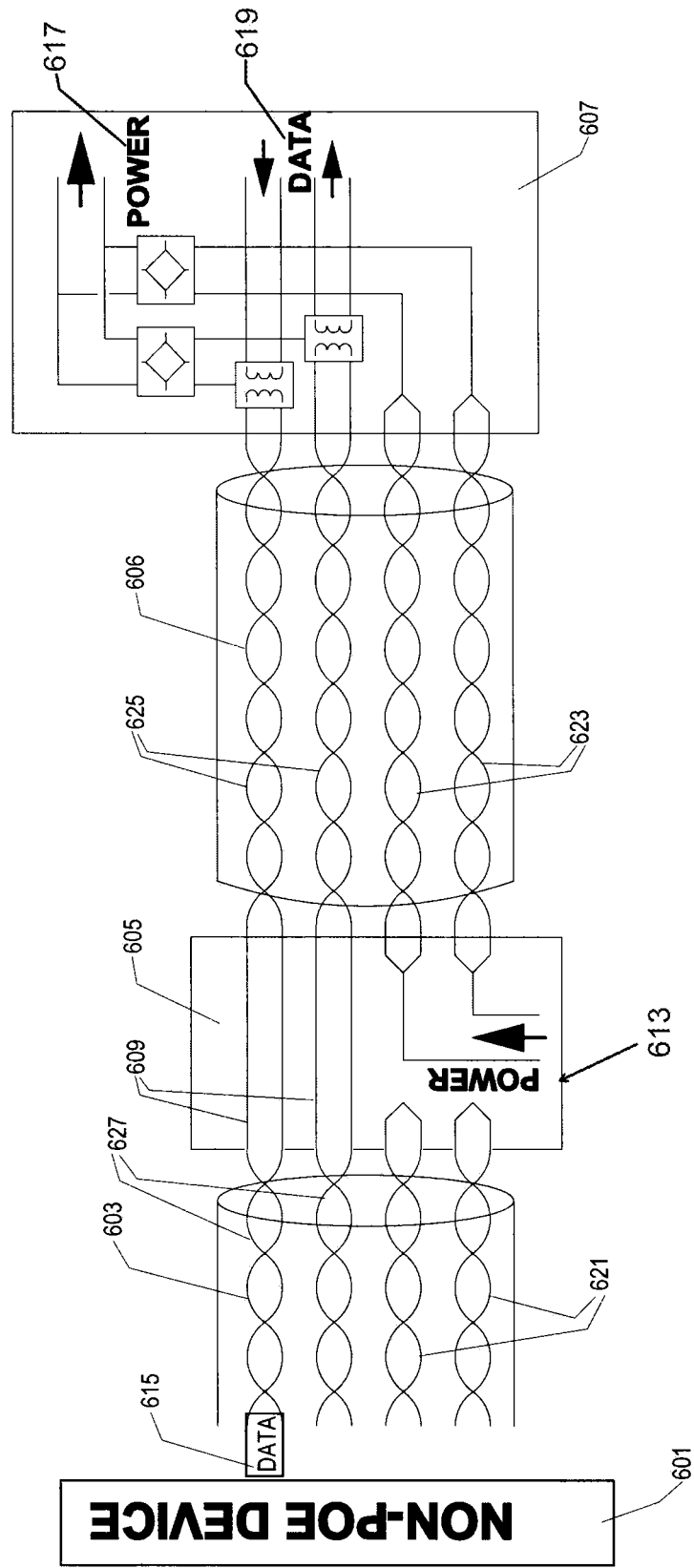
FIG. 6 is a schematic representation of a wiring circuit for a non-PoE ready device.

Still further, a circuit protection system of the present disclosure can be located at the Midspan power sourcing equipment centralized location in the form of patch panel. FIG. 6 is a schematic representation of a wiring circuit for a non-PoE ready device. In FIG. 6, a wiring circuit 600 comprises a non-PoE device 601, a first data transmission portion 603, a power inlet and data transmission Midspan power injector device 605, a second transmission portion 606, and an end device 607. First transmission portion 603 further comprises data 615, conductors 621 and conductors 627. Second transmission portion 606 carries inlet power 613, conductors 623, and data on conductors 625. End devices 607 include transformers 609, bridges 611, data 619 and power 617.

In a non-PoE ready device circuit 600, there is no PSE. The power source for this type of implementation will take the form of an external power supply device. One common device is known as a Midspan injector. External power 613 is located upstream from PoE end device 607. However, the present disclosure can be located any point within the circuit that is downstream from the power supply device. The present disclosure may be incorporated as an integral part of the cables permanent link, such as the RJ45 jack, or may reside as an external component connected to either downstream of the power supply equipment or to the upstream of the powered device. One such example may be a multi-port patch panel located directly downstream from the Midspan injector.

Figure 7:
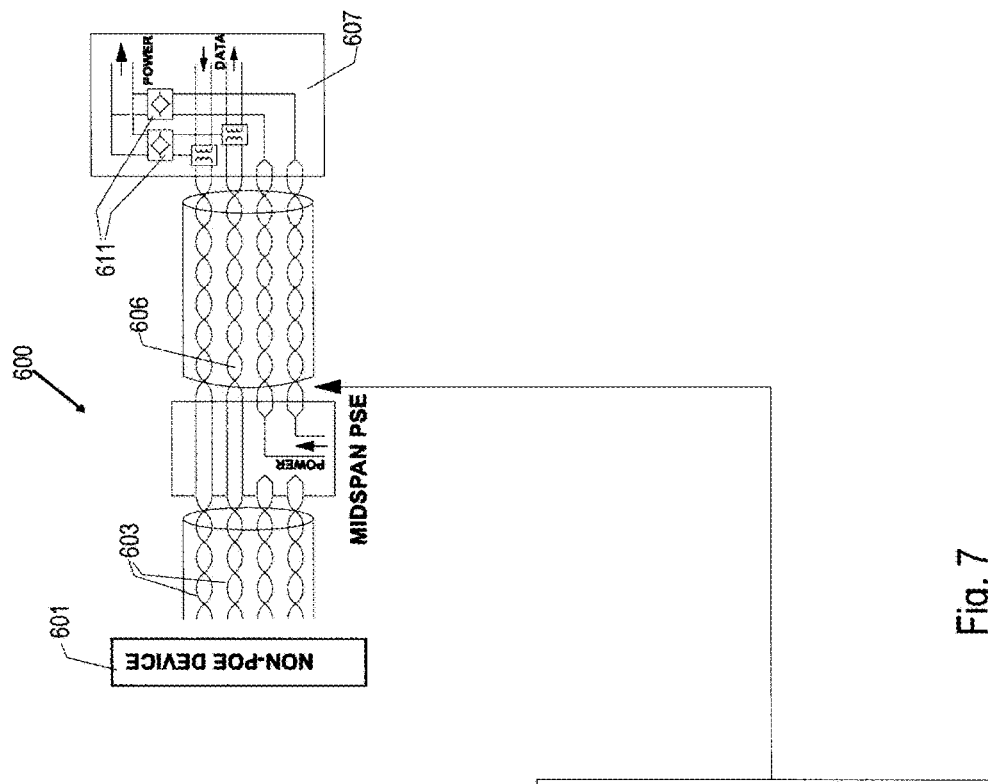
FIG. 7 is a schematic representation of a circuit protection system in a wiring circuit for a non-PoE ready device.
Figure 7:
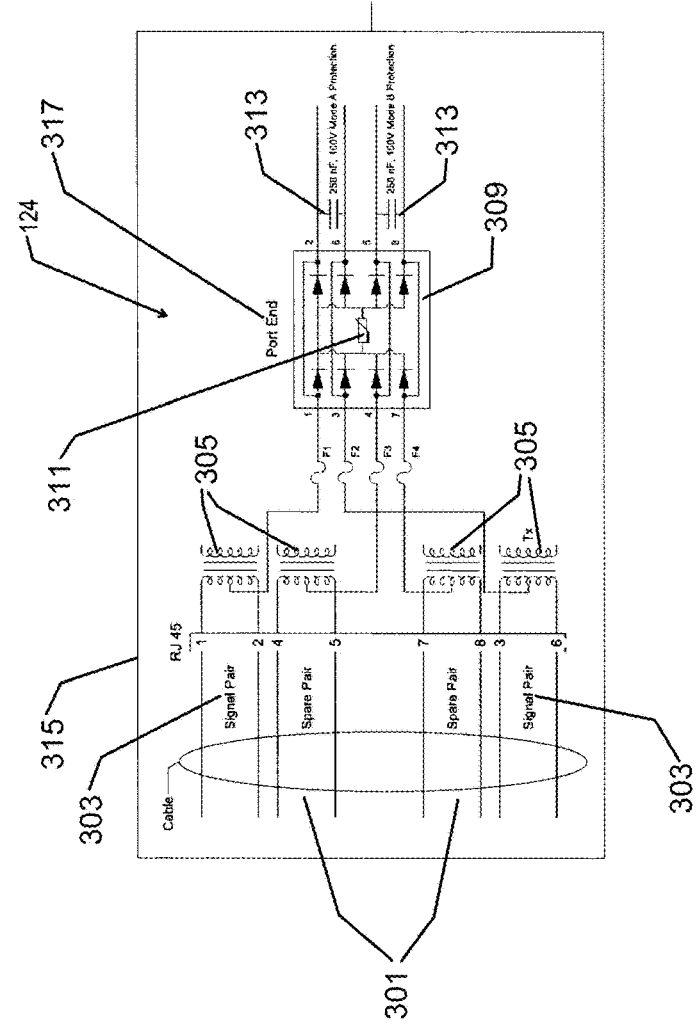

FIG. 7 is a schematic representation of a circuit protection system in a wiring circuit for a non-PoE ready device. In FIG. 7, circuit protection system 100 including circuit module 124 is placed downstream of the Midspan injector. Wiring circuit 600 for a non-PoE ready device in FIG. 7 has been described in FIG. 6 and circuit module 124 has been described in FIG. 3. Therefore, explanation for wiring circuit 600 and circuit module is omitted again. Circuit protection system 100 may be incorporated as an integral part of the cables permanent link, such as the RJ45 jack, or may reside as an external component connected to either downstream of the power supply equipment or to the upstream of the powered device.

A circuit protection system of the present disclosure can also be in different forms.

The present disclosure can have a limiting control point to ensure safety. A professionally trained and licensed installer will have the ability to install a circuit protection system with a 30-watt rating within this system based on the style, rating and other factors of the installed communication system and the designers' usage intent. The use of a receptacle rated for 30 watts can cause a disconnect if an over-current is detected (e.g., fuse or breaker). In the event that a re-settable breaker type of fuse is utilized, at the very least, circuit protection system 100 will trigger a re-examination by the owner and/or manager of the installed communication system to ensure that it will comply with the next generation PoE equipment and requirements.

The present disclosure may also include the use of a color or alpha/alphanumeric designation to be easily seen on the receptacle. The color code will relate directly to a current rating that the designer or installer intends the communication cabling system to be utilized for. When an owner or manager takes control of a pre-installed communication system, the present disclosure will allow the user to determine the maximum power rating of the installed communication components and the methods of implementing the correct protection modules based on the color code or alphas/alphanumeric designation information. The user is now free to implement any PoE powered devices knowing that the facility is protected based on the cabling system instead of solely on the desire to implement a piece of electronics.

Figure 8:
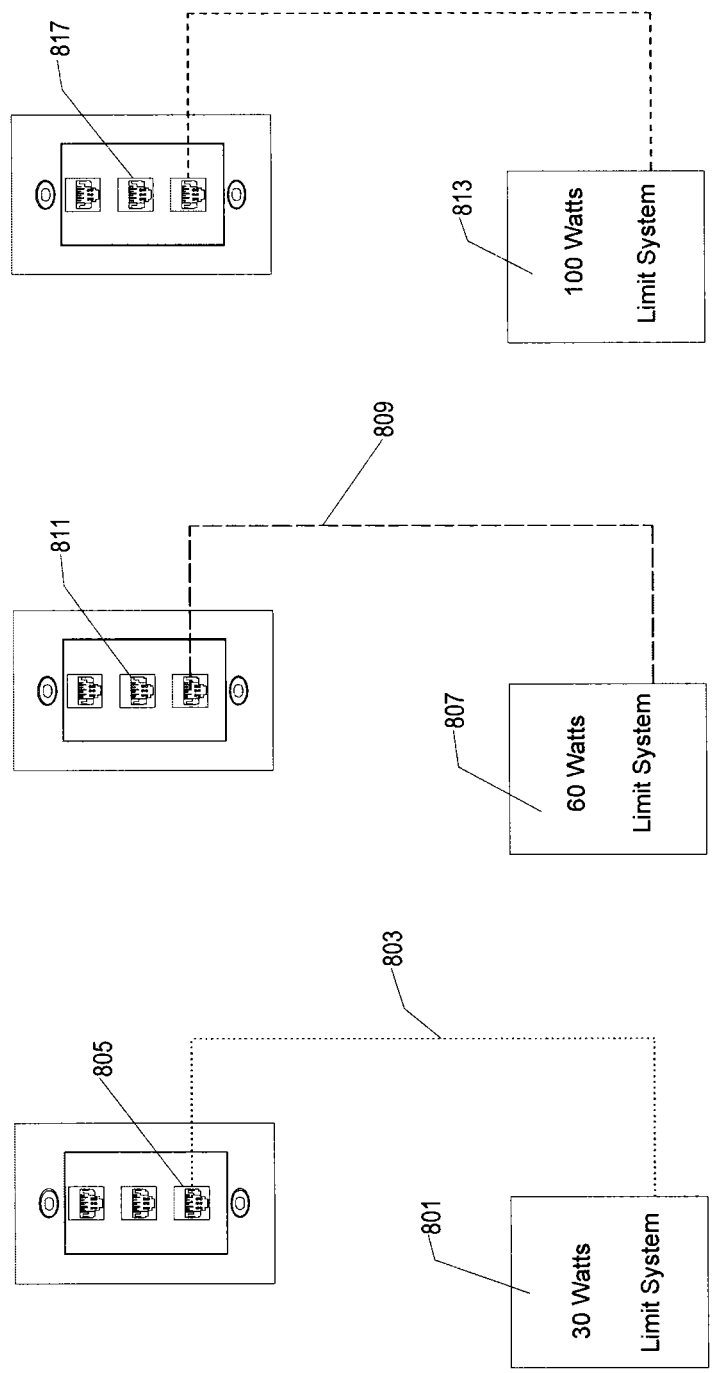
FIG. 8 is a schematic representation of a circuit with color code by power.

FIG. 8 is a schematic representation of a circuit with color code by power. In FIG. 8, a 30-watt PZT camera 801 is connected with a conductor 803, and connector 803 is inserted into an outlet jack 805. Conductor 803 and outlet jack 805 are color-coded in green to designate power limit. Similarly, a 60-watt PZT camera 807 is connected with a conductor 809 that is connected with an outlet jack 811. Conductor 809 and outlet jack 811 are color-coded in purple to designate power limit. Likewise, a 100-watt PZT camera 813 is connected with a conductor 813 that is connected with an outlet jack 817. Conductor 815 and outlet jack 817 are color-coded in yellow to designate power limit.

The circuit protection system can act as a high voltage fuse system. Once the circuit detects an over-current at the outlet receptacle, the circuit will break effectively by disconnecting the end device, and therefore it will protect the cable medium prior to any damage caused by the over-current. For example, over-current and/or over-voltage circuit breakers 307 in FIG. 3 will effectively disconnect the end device when over-current at the outlet receptacle happens.

The circuit protection system can take the shape of a re-settable fuse or may, by design, permanently disable the receptacle that requires professional service to re-activate. This can be seen as a basis for equipment and personal safety and will negate the danger of a non-intentional reset by a non-qualified person. In this embodiment, all source cabling medium will come to a centralized point in a facility, allowing a multiple port protection unit to be implemented.

Further, the present disclosure can be over-current protection from a centralized point (hub) location. This will allow for the protection of the entire network from a single point of administration. This can be a bank of communication circuits emanating from a single hub or main distribution point. Within this main distribution point, each circuit will be protected on an individual basis from over-current or surge. Locating the circuit protection system in a centralized point will enable the whole system administration and safety issues to be detected and resolved in a more efficient manner. This is especially true in building wide, campus and enterprise environments. Again, this embodiment of the circuit protection system can take the shape of a re-settable fuse, or may, by design, permanently disable the circuit requiring professional service to re-activate. This can be set as a basis for equipment and personal safety, and will negate the danger of a non-intentional reset by a non-qualified person.

A circuit protection system of the present disclosure can have many additional features. For example, one embodiment of the present disclosure can show available current at that receptacle by an indicator light or some status indicators 108, as shown in FIGS. 1 and 2. Communication networks in most facilities have both current carrying circuits and non-power carrying circuits. Available current status indictors can be coupled with the color code as outlined above (color is relational to the power detected) in FIG. 8. The color will indicate the available current to allow the end user to match the device to the correct receptacle, which is similar to how the end user matches traditional light bulbs to lamps. The present disclosure can also be capable of visually indicating a fault condition on the circuit.

Within a low voltage system, many current PoE equipment and similar switches do not offer load balancing as a standard feature. Accordingly, the issue of over-current protection becomes more meaningful from an equipment protection and safety points of view. For example, when a switch utilizing a 300-watt power supply supplies power to ten end devices, the total power available to each end device will be 30 watts. When the same PoE switch is utilized to supply power for five end units, the available power can be up to 60 watts. When an embodiment of the present disclosure is utilized at the end device receptacle and has a rating of 30 watts, regardless of the power delivered, 30 watts is the threshold of the receptacle. This will allow protection of the end device regardless of the capability of the source to deliver additional wattage (either intentionally or unintentionally) to the end device.

The availability of load balancing equipment for PoE and other low voltage systems does not directly address the issue of load compatibility with the intended use of the systems. As an example, a circuit protection system as discussed can be installed with the initial design intended to be utilized for a 30 watts per device power usage. The jack receptacles installed in the present disclosure, including jacks, cable, and conductors, are examined and rated for the 30-watt usage.

The POE++ switch now implemented allows for 60-watt devices. At the time with initial implementation, a 30-watt end device is utilized. When the end device is changed to a 60-watt device and activated, the end device will call for 60 watts of power from the new PoE++ switch, the embodiment of the present disclosure will interpret the 60 watts as an over-current event and cause a disconnect or limit the power to the 30 watts within the initial system design and capabilities, because the POE++ switch is only set for 30 watts. Only 30 watts energy passes through the POE++ switch. The POE++ switch will disconnect the circuit, and this disconnect is not intended to protect the active device, but it will serve to prevent damage from over-current to other components within the circuit, such as the cables, jacketing materials and or conductors, preventing a possible catastrophic event such as a fire or arcing.

A further embodiment of the present disclosure can take the form as a user-attached adapter. This adapter can be a small device that will be implemented by a user and will sit between the active device and the cabling outlet receptacle. This embodiment can incorporate any or all of the above aspects of protection and notification as seen in other embodiments. This adapter can also be positioned and utilized as a Go or No-Go device to further help the user understand what type of power is available specifically from a receptacle.

Figure 9:
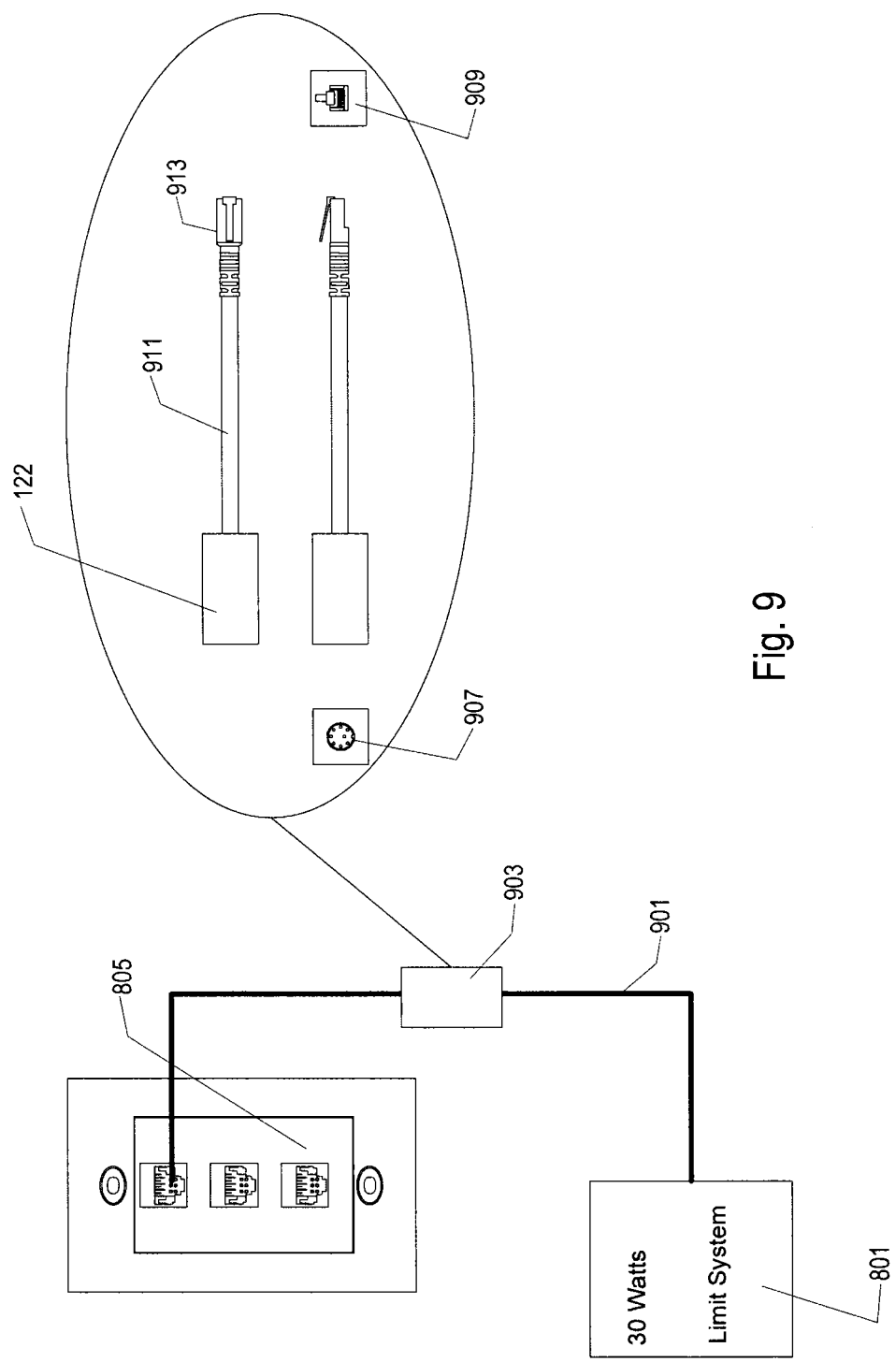
FIG. 9 is a schematic representation of a circuit protection assembly with an external user based adapter.
Figure 10:
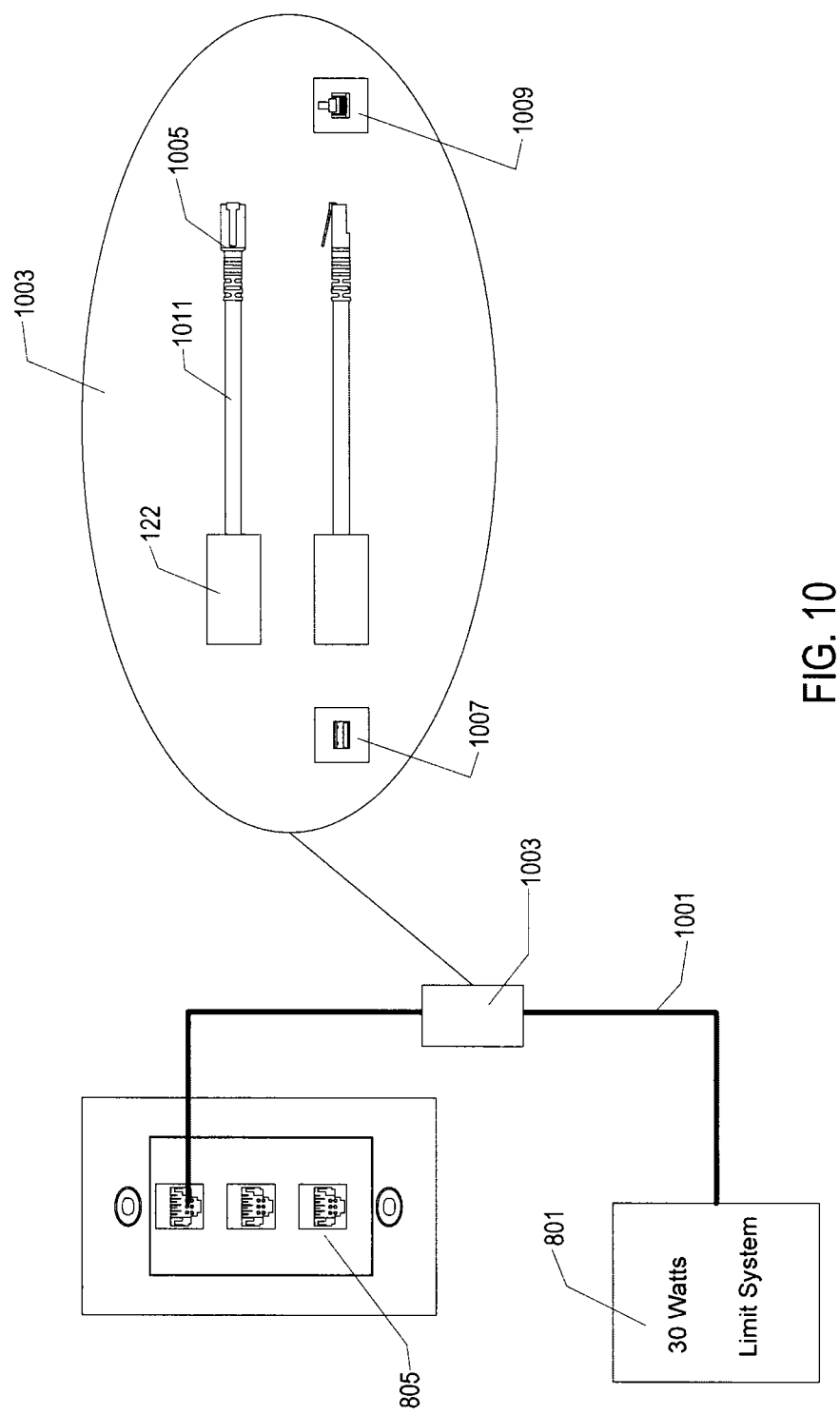
FIG. 10 is a schematic representation of a circuit protection assembly with an external user based adapter.
Figure 11A:
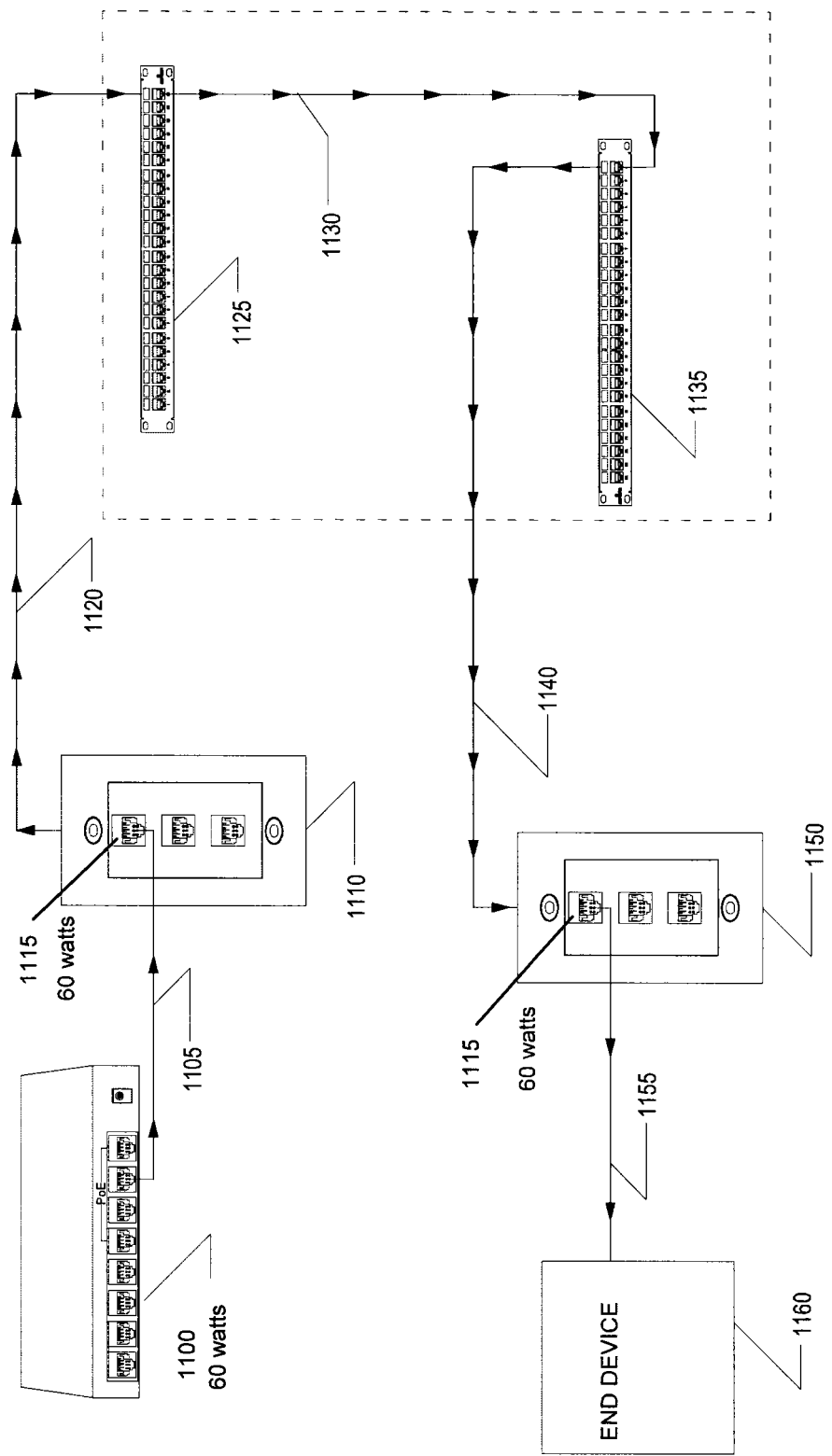
FIGS. 11A-11D are applications of a circuit protection assembly at different power levels.

The external user based adapter can create a transition point between different types of connectors. Currently, as there are few specific codes and standard work on qualified or defined types of connectors available within the low voltage power systems, it can be beneficial to have an adapter capable of providing the above stated protection, notification aspects and allowing adaptation between differing connector styles. An example is that an adapter connects a DIN (i.e., round) connector to an RJ45 communication outlet receptacle. FIG. 9 is a schematic representation of a circuit protection assembly with an external user based adapter. In FIG. 9, 30-watt limit PTZ camera 801 is connected with RJ45 outlet jack 805 through a DIN-DIN patch cord 901. An external adapter 903 can be added between DIN-DIN patch cord 901 and outlet jack 805. External Adapter 903 comprises a DIN interface 907, circuit protection module 124, twisted pair 911 and a RJ45 interface 913. Outlet jack 805 has a RJ45 interface 910. Another example is that an adapter connects a USB connector to an RJ45 communication outlet receptacle. FIG. 10 is a schematic representation of a circuit protection assembly with an external user based adapter. In FIG. 10, 30-watt limit PTZ camera 801 is connected with RJ45 outlet jack 805 through a USB-USB patch cord 1001. An external adapter 1003 can be added between USB-USB patch cord 1001 and outlet jack 805. External Adapter 1003 comprises a USB interface 1007, circuit protection module 124, twisted pair 1011 and a RJ45 interface 1005. The adapter will be the transition point between two different connectors while at the same time ensuring that the installed communication system (i.e. cables, conductors, jacket rating, and associated hardware) is matched to the device that the end user intends to utilize, hence the associated Go/No-Go aspect of the adapter FIGS. 11A-11D are applications of a circuit protection assembly at different power levels. In FIG. 11A, the circuit protection assembly comprises PSE device 1100 that provides power to end device 1160, equipment cord assembly 1105 to connect two ports between wall plate mounted CICM assembly 1115 and end device 1160, two patch panels 1125 and 1135 that provide cabling flexibility to allow connection of two sets of "permanent link" cables 1120 and 1140, and patch cord assembly 1130 that are utilized to connect two ports on or between patch panels 1125 and 1135. The cable performance of patch cord assembly 1130 will normally match cable performance of in-wall permanent link cabling 1120 and 1140. Wall plate 1110 may be any combination of outlets in combination with wall plate mounted CICM assembly 1115.

According to one embodiment of the present disclosure, in FIGS. 11A-11D, in-wall permanent link cabling 1120 and 1140 and patch cord assembly 1130 are all rated at 140 watts. PSE device 1100 is rated at 60 watts in FIG. 11A, PSE device 1101 is rated at 100 watts in FIGS. 11B and 11C, and PSE device 1102 is rated at 140 watts in FIG. 11D.

Figure 11B:
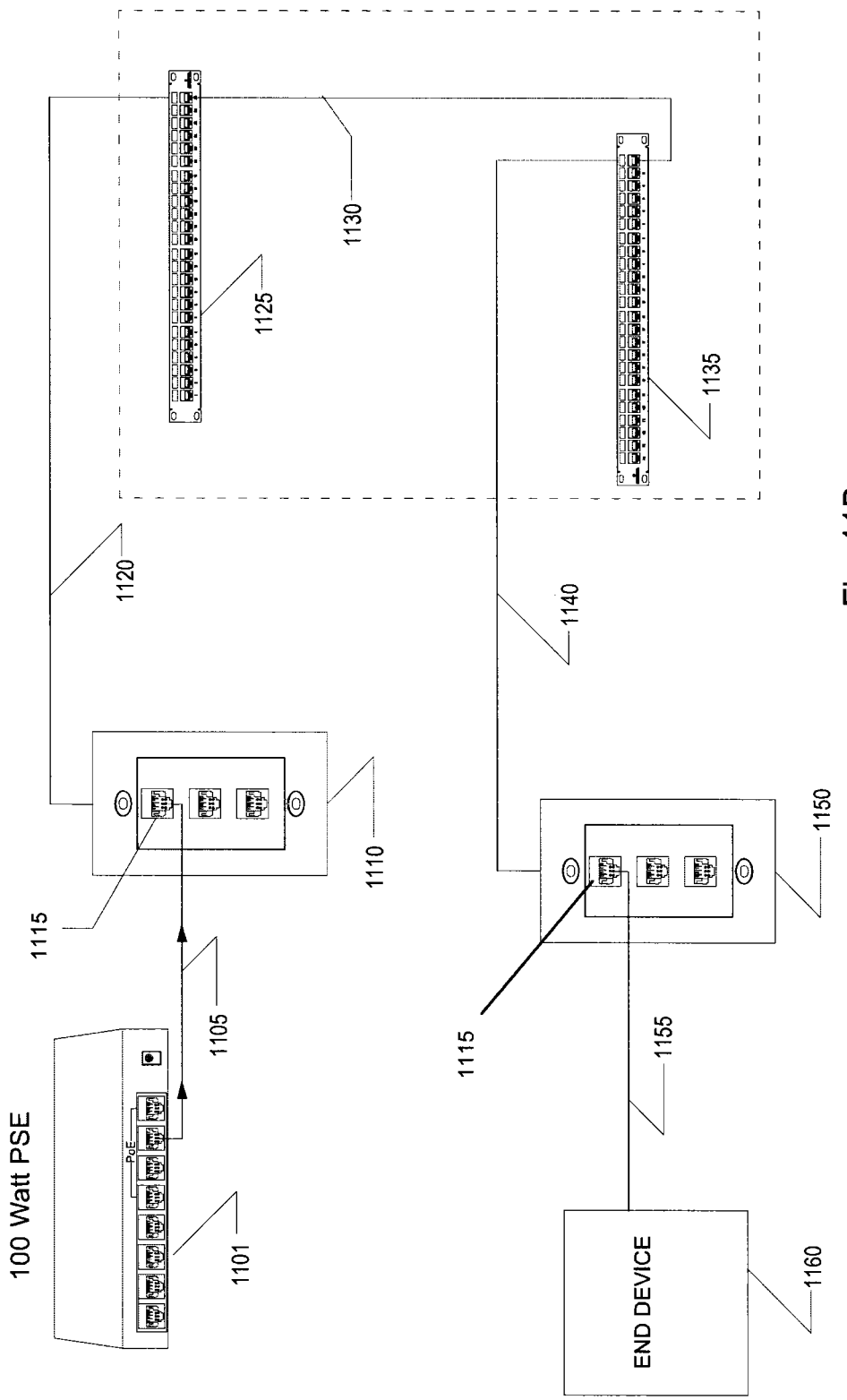
Figure 11C:
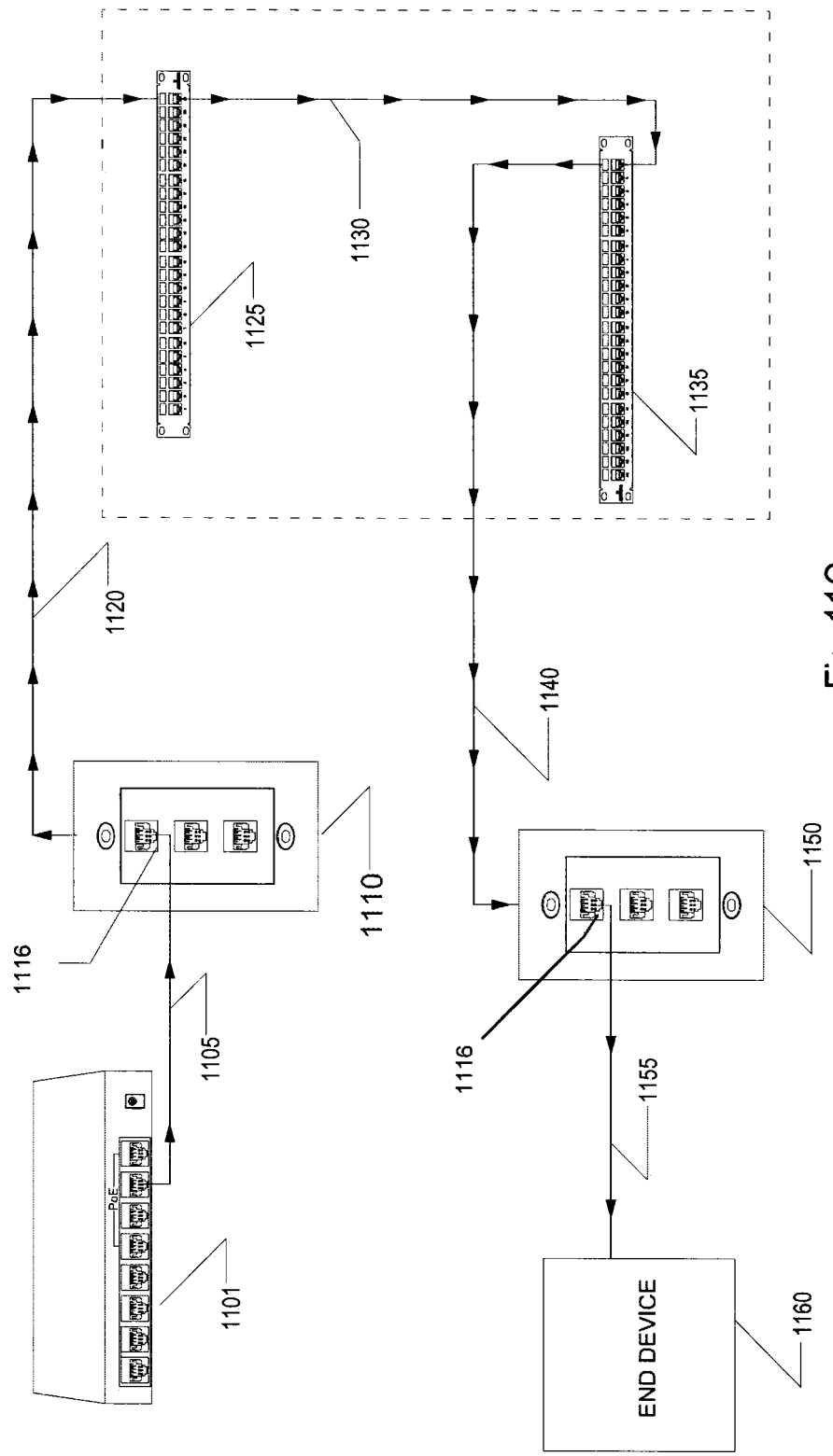
Figure 11D:
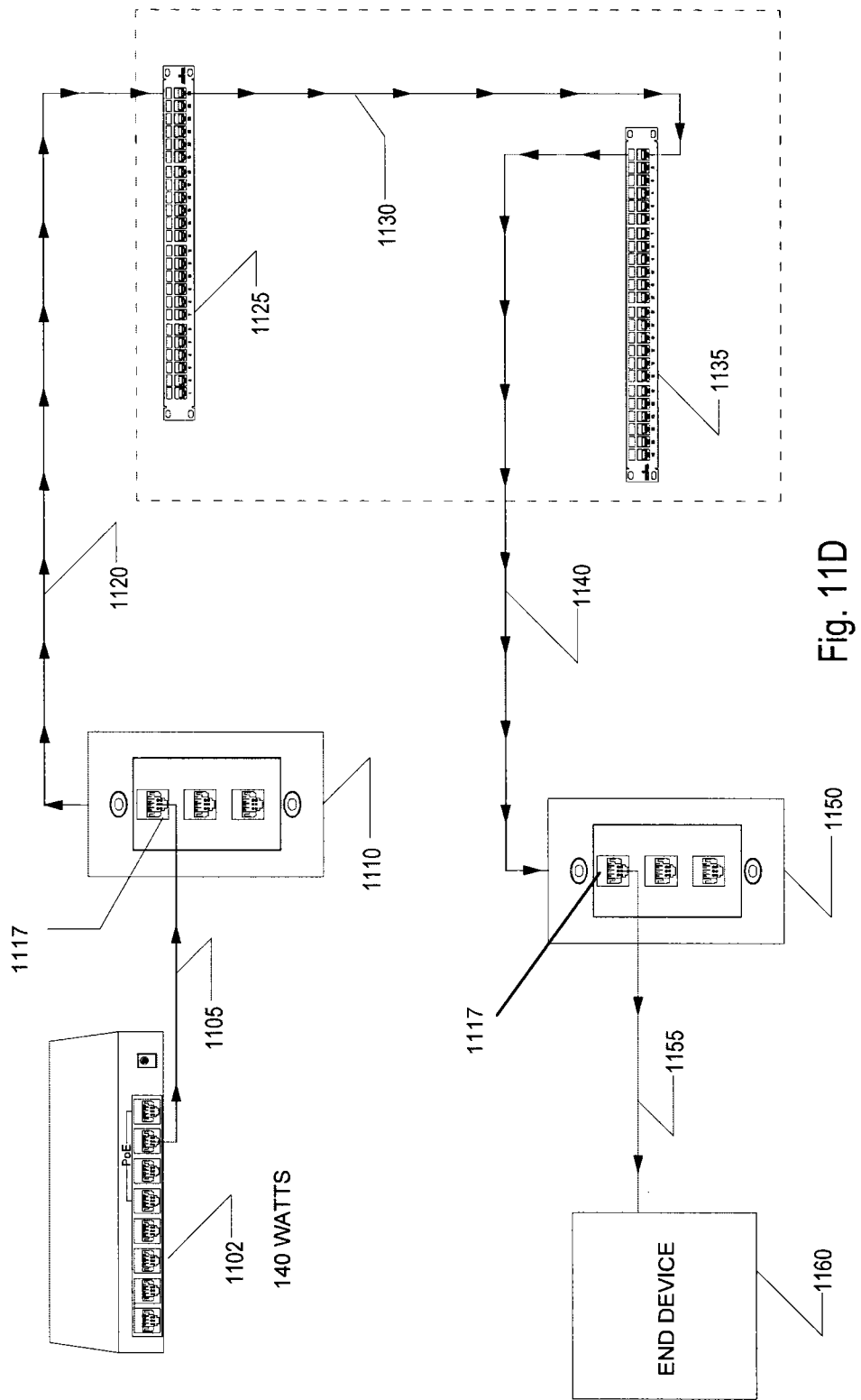

According to one embodiment of the present disclosure, CICM assembly 1115 in FIGS. 11A and 11B is rated at 60 watts, CICM assembly 1116 in FIG. 11C is rated at 100 watts, and CICM assembly 1117 in FIG. 11D is rated at 140 watts.

In FIG. 11A, because PSE device is a 60-watt device, and CICM assembly 1115 is rated at 60 watts, and the in-wall permanent link cabling 1120 and 1140 and patch cord assembly 1130 are all rated at 140 watts. Initial installation with a permit is granted.

In FIG. 11B, as discussed above, PSE device 1101 is 100-watt device and the CICM assembly 1115 is rated at 60 watts, and in-wall permanent link cabling 1120 and 1140 and patch cord assembly 1130 are all rated at 140 watts. When 100 watts PSE device 1101 is implemented on existing system (original installation is for 60 watts usage) with no appropriate engineering consultation, the CICM assembly 1115 is activated. CICM assembly 1115 senses power above the rated power threshold and interrupts the power to end device 1160. Power is interrupted on the circuit of FIG. 11B, which requires an authorized person to service or replace CICM assembly 1115. Accordingly, there is no power between PSE device 1101 and end device 1160.

In FIG. 11C, PSE device 1101 is a 100-watt device, and CICM assembly 1116 is rated at 100 watts, and in-wall permanent link cabling 1120 and 1140 and patch cord assembly 1130 are all rated at 140 watts. After the circuit is interrupted, as discussed in FIG. 11B, the authorized service person evaluates in-wall cabling 1120 and 1140 and associated installation practices and other required aspects of the existing infrastructure. Once all requirements are met, the authorized service person replaces 60 watts CICM assembly 1115 with 100 watts CICM assembly 1116. Accordingly, the circuit of FIG. 11C can now have 100 watts system implemented safely in accordance with national, state and municipal codes.

In FIG. 11D, PSE device 1102 is a 140-watt device, CICM assembly 1116 is rated at 100 watts, and in-wall permanent link cabling 1120 and 1140 and patch code assembly 1130 are all rated at 140 watts. Again, CICM assembly 1116 will activate. CICM assembly 1116 senses power above the rated power threshold and interrupts power. Power is interrupted on the circuit of FIG. 11D, which requires the authorized person to service or replace CICM assembly 1116. Accordingly, there is no power between the PSE device 1102 and end device 1160. The authorized service person can use CICM assembly 1117 rated at 140 watts. Accordingly, end user implements 140 watts PSE device 1102 with appropriate engineering consultation when CICM assembly 1117 is upgraded to reflect 140 watts threshold. During the upgrade process, electrician may be required to meet the requirements of the NEC Code.

The aforementioned present disclosure can be integrated into a full circuit protection system. This system can provide ways of identifying the specific parameters of the installed communication cables through various ways. For example, one way can be developing an application that can utilize a database of vendor part numbers and model numbers. These identifiers will correlate to the specific physical and performance parameters of the specific cable. This information will then be utilized as the basis for a correct choice and implementation of the circuit protection system.

Because the circuit protection system can be in different forms and can be placed in different locations with different features, it is important to note that a range of components for the circuit protection system will be available. Each variant will be utilized to protect the circuit based on the recommendations and codes that can be either current or any other variables in development by industry bodies such as UL, IEEE, ANSI, CENELEC, and ISO, etc. As there is no maximum current limit available to High power over Ethernet (HPoE) communication circuit (HPoE) today, these industry bodies will have the responsibility to designate component requirements, installation practices and safety thresholds. A number of these industry bodies, such as National Fire Protection Association (NFPA) and National Electrical Code (NEC), will create enforceable codes for such equipment based on safety issues. The present disclosure should not be limited to any upper limit of power, and can be designed in conjunction with continually emerging standards and code updates.

It is also important to note that the overprotection may be based solely on the maximum current and associated parameters such as heat rise of the physical cable medium.

It is noted that regardless of equipment over-circuit protection available, the actual limiting parameter is the physical installed cable medium. This can be at the heart of the present disclosure.

It is further noted that a visual aid, such as a color code, can be utilized and possibly be integrated into documents of the standards. This color code will provide a way for a device installer to easily identify the maximum current that a circuit is rated for based on the installed cable.

As PoE and like technologies continue to develop, power levels will continue to increase. The installed cables in a circuit will limit the increase of the power level. The cable can become the weak link in the circuit and may eventually become a point of failure. As melting (degradation) of jacketing material and subsequent arcing is the likely outcome of failure within the physical cable medium, the melting issue becomes an issue of life safety.

Once the correct model of circuit protection system is identified through the use of an Application or database, a decision can be made to protect the circuit at either a central location, i.e., distribution closet or ceiling box, or at peripheral locations such as wall outlets.

When a circuit protection system is applied to PoE ready devices, a wiring circuit may look similar to, but not limited to, the exemplary embodiment as shown in FIG. 4. As discussed above in FIG. 5, the circuit protection system can be located at the outlet to protect the end device.

When a circuit protection system is applied to Non-PoE ready devices, the wiring circuit may look similar to, but not limited to, the exemplary embodiment as shown in FIG. 6. As discussed in FIG. 7, the circuit protection system can be located downstream of the Midspan PSE centralized location in the form of patch panel.

As shown by the above embodiments in FIGS. 6 and 8, the ability to locate a circuit protection system at various points in the communication wire circuit is an advantage of the present disclosure.

Different approaches to the physical layer cable plant will necessitate various installation locations in order to maintain high overall system efficiency. As shown in one embodiment of the present disclosure, with the circuit protection system integrated into the wiring jacks and/or outlets, it will allow the present disclosure to be implemented as required regardless of cable plant topology.

Over-current protection of the present disclosure is necessary and important. As stated above, conventional communication cable, conductors, jacketing materials and connectors are not designed to withstand the increased amperage, associated heat generation and material degradation presented by the transmission of higher power and conventional installation practice.

Further, the present disclosure can help a local inspector or authority having jurisdiction (AHJ) have a basis on which to evaluate the compliance of the system for the intended use prior to granting final inspection permit. This basis also allows for the argument of negligence to be more properly focused if an event occurs.

FIG. 12 depicts a basic circuit showing a DIP switch 1205 in the protection circuit according to one embodiment of the present disclosure, wherein a Zener diode 1201 and protection circuit 1203 having a DIP switch 1205, which sets the power level setting at 0.35/0.60/1.00, are disposed between power sourcing equipment 1207 and powered device 1209.

FIGS. 13-16 depict a basic circuit wherein DIP switch 1205 is replace with a solid state device 1301.

Solid state device 1301 has imbedded firmware enabling it to perform the following steps:

Establish power threshold:
  User programmable power threshold
  Auto programmable power threshold based on Powered Equipment request
  Auto programmable power threshold based on Powered Equipment empirical need CICM protection circuit: cause/action:
  Power on circuit exceeds pre-set power threshold/power flow stopped
  CICM senses heat rise in cable exceeding threshold/power flow stopped
  PD request power from PSE that exceeds power threshold/power flow stopped CICM Basic operation:
1. PSE sending query to circuit
2. PSE query passes through CICM (Zener diode)
3. PD senses PSE query and responds
4. PD response passes through CICM (Zener diode)
5. Zener diode activates CICM protection circuit
6. PSE senses PD response and begins power flow
7. Power flow passes through CICM protection circuit
8. Power flow between PSE and PE established CICM power level exceeds set threshold operation:
1. PSE sending query to circuit
2. PSE query passes through CICM (Zener diode)
3. PD senses PSE query and responds
4. PD response passes through CICM (Zener diode)
5. Zener diode activates CICM protection circuit
6. PSE senses PD response and begins power flow
7. Power flow passes through CICM protection circuit
8. PSE power level exceeds predetermined threshold of solid state device
9. CICM opens to prevent power flow
10. Power flow between PSE and PD stopped CICM heat rise exceeds set threshold operation:
1. PSE sending query to circuit
2. PSE query passes through CICM (Zener diode)
3. PD senses PSE query and responds
4. PD response passes through CICM (Zener diode)
5. Zener diode activates CICM protection circuit
6. PSE senses PE response and begins power flow
7. Power flow passes through CICM protection circuit
8. CICM Thermistor senses a heat rise
9. Heat rise exceeds threshold
10. CICM opens to prevent power flow
11. Power flow between PSE and PE stopped CICM Auto programmable operation:
1. PSE sending query to circuit
2. PSE query passes through CICM (Zener diode)
3. PE senses PSE query and responds
4. PD response passes through CICM (Zener diode)
5. Zener diode activates CICM protection circuit
6. PSE senses PD response and begins power flow
7. Power flow passes through CICM protection circuit
8. Power flow between PSE and PE established
9. Solid State device measures established power from PSE to PD and sets threshold at closest exceeding code based threshold "energy band"; i.e. 15.4 w, 30 w, 60w, etc
10. Power level exceeds Auto programed threshold of solid state device
11. CICM opens to prevent power flow
12. Power flow between PSE and PD stopped CICM remote programmable operation:
1. Solid state device power threshold is pre-set a specific threshold at factory
2. PSE sending query to circuit
3. PSE query passes through CICM (Zener diode)
4. PE senses PSE query and responds
5. PD response passes through CICM (Zener diode)
6. Zener diode activates CICM protection circuit
7. PSE senses PD response and begins power flow
8. Power flow passes through CICM protection circuit
9. Power flow between PSE and PE established
10. Solid State device power threshold can now be re-set remotely by user to reflect changes in equipment, i.e. 15.4 w, 30 w, 60 w, etc
11. Power level exceeds Auto programed or re-set threshold of solid state device
12. CICM opens to prevent power flow
13. Power flow between PSE and PD stopped It is noted that the exemplary embodiments of the present disclosure applied in PoE or non-PoE device are utilized herein to show various forms and placements of the present disclosure. An application of the present disclosure in a PoE device may be utilized for a non-PoE device, and vice versa.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure will not be limited to the particular embodiment(s) disclosed as the best mode contemplated, but that the disclosure will include all embodiments falling within the scope of the appended claims.

What is claimed is:

1. A Power over Ethernet (PoE) cable medium circuit protection module comprising:
    an over-current and/or over-voltage circuit module and/or a heat circuit protector which measures or detects heat rise of said PoE cable medium,
    wherein said over-current and/or over-voltage circuit module comprises a switching device for setting a predetermined power level for said over-current and/or over-voltage circuit module, thereby prohibiting transmission of electrical power over said PoE cable medium which exceeds said predetermined power level and/or preventing excessive heat build-up on said PoE cable medium.

2. The cable medium circuit protection module according to claim 1, wherein said over-current and/or over-voltage circuit module is a circuit board.

3. The cable medium circuit protection module according to claim 2, wherein said over-current and/or over-voltage circuit module is a wall plate assembly that comprises jack interface.

4. The cable medium circuit protection module according to claim 1, wherein said switching device is at least one selected from the group consisting of: jumpers, DIP switches, and any solid state device.

5. The cable medium circuit protection module according to claim 1, wherein said over-current and/or over-voltage circuit module is a fusible link.

6. The cable medium circuit protection module according to claim 5, wherein said fusible link is a re-settable fuse.

7. The cable medium circuit protection module according to claim 1, wherein said heat circuit protector is a thermistor.

8. A Power over Ethernet (PoE) cable medium circuit protection module comprising: an over-current and/or over-voltage circuit module and/or a heat circuit protector which measures or detects heat rise of said PoE cable medium, wherein said over-current and/or over-voltage circuit module comprises a switching device for setting a predetermined power level for said over-current and/or over-voltage circuit module, thereby prohibiting transmission of electrical power over said PoE cable medium which exceeds said predetermined power level and/or preventing excessive heat build-up on said PoE cable medium, further comprising: a communication jack, a transformer and a protection outlet port, wherein said communication jack is followed by said transformer, and said overcurrent and/or over-voltage circuit module and said heat circuit protector are disposed between said transformer and said protection outlet port.

9. The cable medium circuit protection module according to claim 1, wherein said heat circuit protector detects a temperature change over time for a cable conductor.

10. The cable medium circuit protection module according to claim 9, wherein the temperature change comprises a change induced by ambient temperature.

11. The cable medium circuit protection module according to claim 1, wherein said over-current and/or over-voltage circuit module comprises at least a relay and another fuse, the relay being a primary mechanism of protection and the other fuse being a secondary mechanism of protection.

12. A Power over Ethernet (PoE) cable medium circuit protection module comprising: an over-current and/or over-voltage circuit module and/or a heat circuit protector which measures or detects heat rise of said PoE cable medium, wherein said over-current and/or over-voltage circuit module comprises a switching device for setting a predetermined power level for said over-current and/or over-voltage circuit module, thereby prohibiting transmission of electrical power over said PoE cable medium which exceeds said predetermined power level and/or preventing excessive heat build-up on said PoE cable medium, wherein said switching device sets the power threshold level of the cable medium circuit protection module and wherein said cable medium circuit protection module further comprises a diode device that prevents a power supply from powering up a powered device until said powered device is identified and responds to a request from said power supply to deliver electrical power.

13. A Power over Ethernet (PoE) cable medium circuit protection module comprising: an over-current and/or over-voltage circuit module and/or a heat circuit protector which measures or detects heat rise of said PoE cable medium, wherein said over-current and/or over-voltage circuit module comprises a switching device for setting a predetermined power level for said over-current and/or over-voltage circuit module, thereby prohibiting transmission of electrical power over said PoE cable medium which exceeds said predetermined power level and/or preventing excessive heat build-up on said PoE cable medium, wherein said switching device is a solid state device that sets said predetermined power level for said over-current and/or over-voltage circuit module via the following steps: remotely toggling preset factor power levels; after initial circuit activation, sensing the current draw of the powered device, and setting a new power level based upon the sensed current draw of the powered device.

14. The cable medium circuit protection module according to claim 1, wherein said over-current and/or over-voltage circuit module further comprises a plurality of clamping diodes, fuses, and/or light-emitting diodes.

15. The cable medium circuit protection module according to claim 1, further comprising a transceiver which transmits a signal to an external receiver when said electrical power exceeds a predetermined power level and/or when said excess heat build-up on said PoE cable medium is detected.

16. A communication circuit protection system for protection of a PoE cable medium, said circuit protection system comprising:
   a power supply,
   a powered device, and
   a circuit protection module comprising an over-current and/or over-voltage circuit module and/or a heat circuit protector which measures and/or detects heat rise of said PoE cable medium, said circuit protection module further comprising a diode device that prevents a power supply from powering up a powered device until said powered device responds to a request from said power supply to identify itself, and wherein said circuit protection system is disposed between said power supply and said powered device, such that when said power supply transmits a request to said powered device, said diode device will detect a response from said powered device identifying itself and activate said circuit protection module, thereby enabling said over-current and/or over-voltage circuit module to interrupt the flow of said electrical power through said PoE cable medium when said circuit protection module detects (1) that said electrical power exceeds a predetermined power level of said circuit protection module set for said PoE cable medium and/or (2) excess heat build-up on said PoE cable medium, thereby prohibiting transmission of said electrical power over said PoE cable medium, wherein said over-current and/or over-voltage circuit module further comprises a switching device for setting said predetermined power level of said circuit protection module.

17. The communication circuit protection system according to claim 16, wherein said switching device is at least one selected from the group consisting of: jumpers, DIP switches, and any solid state device.

18. The communication circuit protection system according to claim 17, wherein said switching device is a solid state device that sets said predetermined power level for said over-current and/or over-voltage circuit module via the following steps: remotely toggling preset factor power levels; after initial circuit activation, sensing the current draw of the powered device, and setting a new power level based upon the sensed current draw of the powered device.

19. The communication circuit protection system according to claim 16, wherein said over-current and/or over-voltage circuit module further comprises a plurality of clamping diodes, fuses, and/or light-emitting diodes.

20. The communication circuit protection system according to claim 16, further comprising a transceiver which transmits a signal to an external receiver when said electrical power exceeds a predetermined power level and/or when said excess heat build-up on said PoE cable medium is detected.

21. The communication circuit protection system according to claim 16, wherein said diode device is a Zener diode.

22. A method for protecting a PoE cable medium of a communication circuit protection system, comprising:
   disposing, between a power supply and a powered device, a circuit protection module that comprises an overcurrent and/or over-voltage circuit module and/or a heat circuit protector for protection of said PoE cable medium within said circuit, said circuit protection module further comprising a diode device, sending a request from said power supply to said powered device via said circuit protection module, sending an identification response from said powered device to said power supply via said circuit protection module, detecting by said diode device that said powered device has sent said response to said power supply, and enabling said power supply to deliver electrical power to said circuit protection module and said powered device over said PoE cable medium, and interrupting the delivery of said electrical power over said PoE cable medium to said powered device if (1) said over-current and/or over-voltage circuit module determines that said electrical power from said power supply exceeds a predetermined power level and/or (2) said heat circuit protector detects excessive heat build-up in said PoE cable medium, wherein said over-current and/or over-voltage circuit module further comprises a switching device for setting said predetermined power level of said circuit protection module.

23. The method according to claim 22, wherein said diode device is a Zener diode.

24. The method according to claim 22, wherein said switching device is a solid state device that sets said predetermined power level for said over-current and/or over-voltage circuit module via the following steps: remotely toggling preset factor power levels; after initial circuit activation, sensing the current draw of the powered device, and setting a new power level based upon the sensed current draw of the powered device.

25. The method according to claim 22, wherein said over-current and/or over-voltage circuit module further comprises a plurality of clamping diodes, fuses, and/or light-emitting diodes.

26. The method according to claim 22, further comprising monitoring and/or transmitting a signal to an external receiver when said electrical power exceeds a predetermined power level and/or when said excess heat build-up on said PoE cable medium is detected.

* * * * *